(12) United States Patent
Kakuda et al.

(10) Patent No.: US 7,855,887 B2
(45) Date of Patent: Dec. 21, 2010

(54) INVERTER UNIT

(75) Inventors: Kentaro Kakuda, Anjo (JP); Ryohei Kubo, Anjo (JP)

(73) Assignee: Aisin AW Co., Ltd., Anjo (JP)

( * ) Notice: Subject to any disclaimer, the term of this patent is extended or adjusted under 35 U.S.C. 154(b) by 71 days.

(21) Appl. No.: 12/320,341

(22) Filed: Jan. 23, 2009

(65) Prior Publication Data

US 2009/0206662 A1 Aug. 20, 2009

(30) Foreign Application Priority Data

Feb. 15, 2008 (JP) .............................. 2008-034689

(51) Int. Cl.
*H05K 7/20* (2006.01)
(52) U.S. Cl. ................... 361/699; 361/689; 361/704; 361/707; 361/715; 165/80.4; 165/104.33; 174/15.1
(58) Field of Classification Search ................... None
See application file for complete search history.

(56) References Cited

U.S. PATENT DOCUMENTS

| | | | |
|---|---|---|---|
| 6,648,062 B2* | 11/2003 | Fukazu et al. ............... | 165/80.3 |
| 6,745,823 B2* | 6/2004 | Brost ......................... | 165/80.4 |
| 6,961,244 B2* | 11/2005 | Tsuchiya et al. ............. | 361/710 |
| 7,417,857 B2* | 8/2008 | Rondier et al. .............. | 361/699 |
| 7,504,720 B2* | 3/2009 | Nakatsu et al. .............. | 257/712 |
| 7,710,721 B2* | 5/2010 | Matsuo et al. ............... | 361/699 |
| 2007/0031728 A1 | 2/2007 | Lee et al. | |
| 2009/0195093 A1* | 8/2009 | Bandai et al. ................. | 310/54 |
| 2010/0072865 A1* | 3/2010 | Endo et al. .................. | 310/68 D |

FOREIGN PATENT DOCUMENTS

| | | |
|---|---|---|
| JP | A-2-100350 | 4/1990 |
| JP | A-7-243666 | 9/1995 |
| JP | A-2000-60106 | 2/2000 |
| JP | A-2000-92858 | 3/2000 |
| JP | A-2004-335725 | 11/2004 |
| JP | A-2005-294456 | 10/2005 |
| JP | A-2006-230064 | 8/2006 |
| JP | A-2007-42647 | 2/2007 |
| JP | A-2007-89258 | 4/2007 |
| JP | A-2007-168512 | 7/2007 |
| JP | A-2007-207917 | 8/2007 |
| JP | A-2007-313982 | 12/2007 |
| WO | WO 2007/089011 A1 | 8/2007 |
| WO | WO 2007/136122 A1 | 11/2007 |

* cited by examiner

*Primary Examiner*—Boris L Chervinsky
(74) *Attorney, Agent, or Firm*—Oliff & Berridge, PLC

(57) ABSTRACT

An inverter unit includes a reactor and switching elements that form a voltage boost circuit that boosts a power supply voltage; a switching element for an inverter that forms an inverter circuit to be supplied with the power supply voltage boosted by the voltage boost circuit; and a cooling unit provided with a coolant passage that carries coolant along a cooling face with which the reactor and the switching elements of the voltage boost circuit and the switching element of the inverter circuit are in contact.

20 Claims, 10 Drawing Sheets

INVERTER UNIT

INCORPORATION BY REFERENCE

The disclosure of Japanese Patent Application No. 2008-034689 filed on Feb. 15, 2008 including the specification, drawings and abstract is incorporated herein by reference in its entirety.

BACKGROUND

The present invention relates to an inverter unit.

There exists a control unit for rotating electrical machines (a motor and generator) included in a drive unit that is used in an electric vehicle, hybrid vehicle or the like. An inverter unit as the control unit includes an inverter that controls such rotating electrical machines has been developed in recent years. Such an inverter unit may be structured such that a voltage boost circuit for boosting a power supply voltage is included to increase the outputs of the rotating electrical machines during high speed rotation thereof (for example, as described in Japanese Patent Application Publication No. JP-A-2007-89258 (Pages 11 to 12 and FIGS. 2 and 6)).

In the inverter unit, a reactor and switching elements for voltage boosting, which form the voltage boost circuit, are heat generating components as well as switching elements for the inverter that form inverter circuits that need to be properly cooled. The inverter unit disclosed in JP-A-2007-89258, therefore, includes a cooling plate with a coolant provided therein. The inverter unit has a structure for cooling the components forming the circuits such that the switching elements and a capacitor for voltage boosting are disposed to be in contact with one side of the cooling plate, and the reactor and capacitor for smoothing are disposed to be in contact with the other side thereof.

The above inverter unit is structured such that a coolant passage in the cooling plate is guided almost in a U shape inside the cooling plate. In other words, the coolant passage in the cooling plate has an outbound passage for cooling one half of the cooling plate and an inbound passage for cooling the other half thereof in the width direction thereof (hereinafter referred to as "the width direction"). The coolant flowing into the cooling plate flows in the outbound passage from one side to the other in the longitudinal direction of the cooling plate, turns there, and flows in the inbound passage back to the one side in the longitudinal direction. With regard to the reactor and switching elements that generate most of the heat of the circuit components, the reactor is disposed on the one side in the longitudinal direction of the cooling plate, and the switching elements are disposed on the other side in the longitudinal direction of the cooling plate. In other words, the reactor is disposed closer to the side on which the inlet and outlet of the coolant passage are provided, compared to the switching elements.

SUMMARY

The coolant flowing in the cooling plate, therefore, first cools half of the reactor in the width direction in the outbound passage, next cools half of and then the other half of the switching elements in the width direction, and lastly the other half of the reactor in the width direction. Thus, half of the reactor in the width direction is cooled by the cooler coolant, while the other half in the width direction is cooled by the warmer coolant that has already cooled the switching elements, which may cause a situation in which the other half in the width direction is not adequately cooled. When the reactor cooling is out of balance like this, there is a possibility in that the voltage boost circuit cannot perform adequately.

The present invention provides an inverter unit that includes a voltage boost circuit for boosting a power supply voltage, capable of cooling evenly the entire reactor forming the voltage boost circuit and of cooling properly the switching elements forming the voltage boost circuit and inverter circuits. The present invention can also achieve various other advantages.

An inverter unit according to an exemplary aspect of the present invention includes a reactor and switching elements that form a voltage boost circuit that boosts a power supply voltage; a switching element for an inverter that forms an inverter circuit to be supplied with the power supply voltage boosted by the voltage boost circuit; and a cooling unit provided with a coolant passage that carries coolant along a cooling face with which the reactor and the switching elements of the voltage boost circuit and the switching element of the inverter circuit are in contact, wherein: the coolant passage includes a reactor cooler that cools an area on the cooling face with which the reactor is in contact, and a switching element cooler that cools an area on the cooling face with which the switching elements of the voltage boost circuit and the switching element of the inverter circuit are in contact, and the reactor cooler is disposed upstream with respect to the switching elements cooler.

An inverter unit according to an exemplary aspect of the present invention includes a reactor and switching elements that form a voltage boost circuit that boosts a power supply voltage; a switching element for an inverter that forms an inverter circuit to be supplied with the power supply voltage boosted by the voltage boost circuit; and a cooling unit provided with a coolant passage that carries coolant along a cooling face with which the reactor and the switching elements of the voltage boost circuit and the switching element of the inverter circuit are in contact, wherein the reactor, the switching elements of the voltage boost circuit and the switching element of the inverter circuit are arranged such that the coolant cools the reactor before the switching elements of the voltage boost circuit and the switching element of the inverter circuit.

BRIEF DESCRIPTION OF THE DRAWINGS

Various exemplary aspects of the invention will be described with reference to the drawings, wherein.

DETAILED DESCRIPTION OF THE PREFERRED EMBODIMENTS

One embodiment according to the present invention will be described hereinafter, referring to the accompanying drawings. In the embodiment, the present invention will be described by taking, as an example, a situation in which it is applied to an inverter unit 1 for controlling a motor M and generator G included in a drive unit 2 for a hybrid vehicle.

1. Structures of Drive Unit

Figure 4:
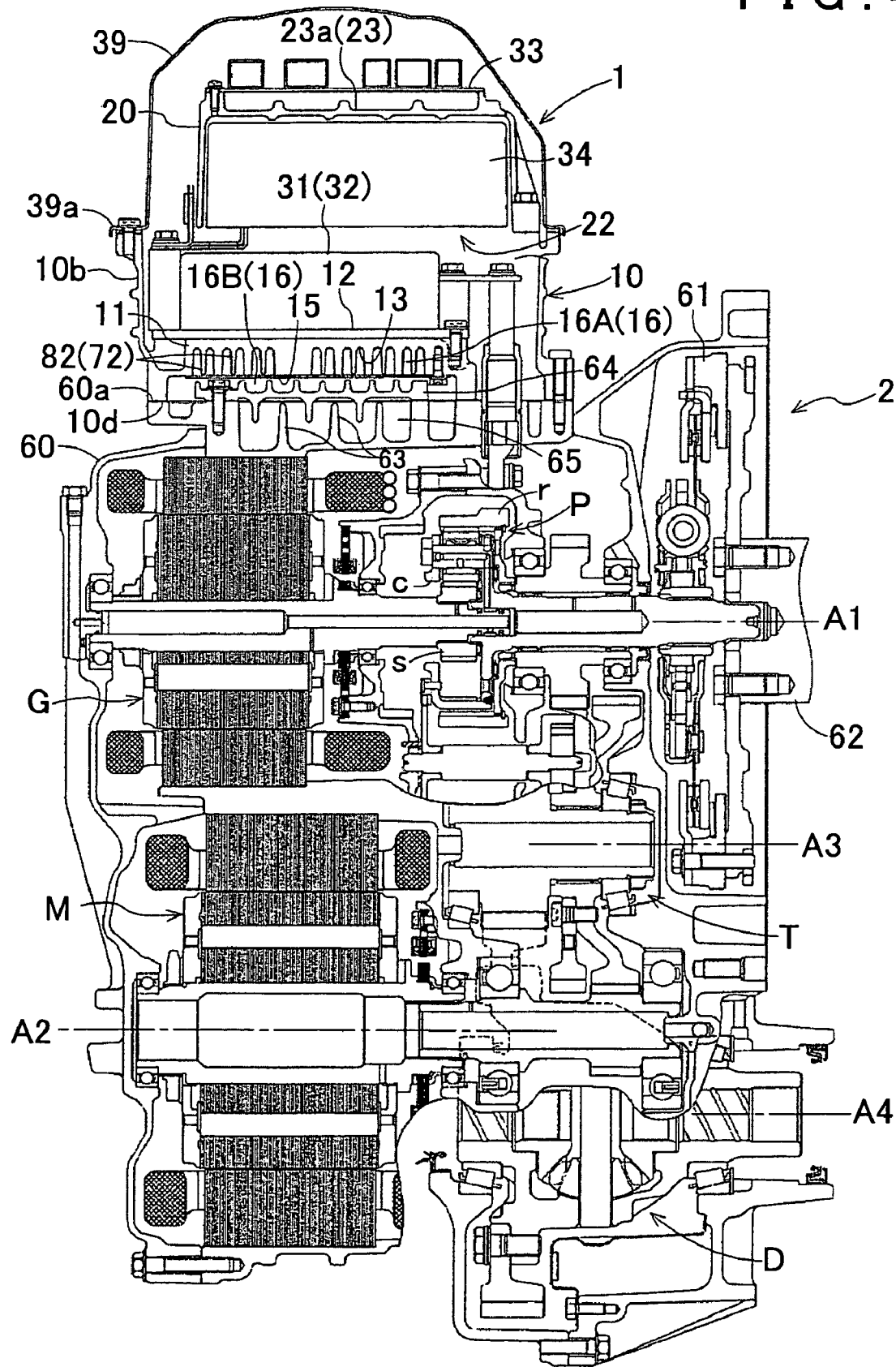
FIG. 4 is a sectional view of the drive unit taken in the axial direction.

The structures of the drive unit 2 for a hybrid vehicle including the motor M and generator G to be controlled by the inverter unit 1 according to the embodiment will be described hereinafter. As shown in FIG. 4, the drive unit 2 has, as its main structure, a generator G and a planetary gear mechanism P serving as a power transfer that are disposed on a first axis A1, a motor M that is disposed on a second axis A2, and a differential unit D that is disposed on a forth axis A4. A counter gear mechanism T that drivably connects an output rotor of the planetary gear mechanism P and the motor M to the differential unit D is disposed on a third axis A3. The planetary gear mechanism P is a single-pinion type planetary gear mechanism; a sun gear s is connected to the generator G; a carrier c is connected to an output shaft 62 of an engine via a damper 61 that is disposed on the first axis A1; and a ring gear r functions as an output rotor, connected to the counter gear mechanism T. All structures of the drive unit 2 are accommodated in a drive unit case 60. The output varies between the motor M and generator G, and the output of the motor M is set larger than that of the generator G. In the embodiment, the motor M and generator G are examples of rotating electrical machines according to one aspect of the present invention.

Figure 3:
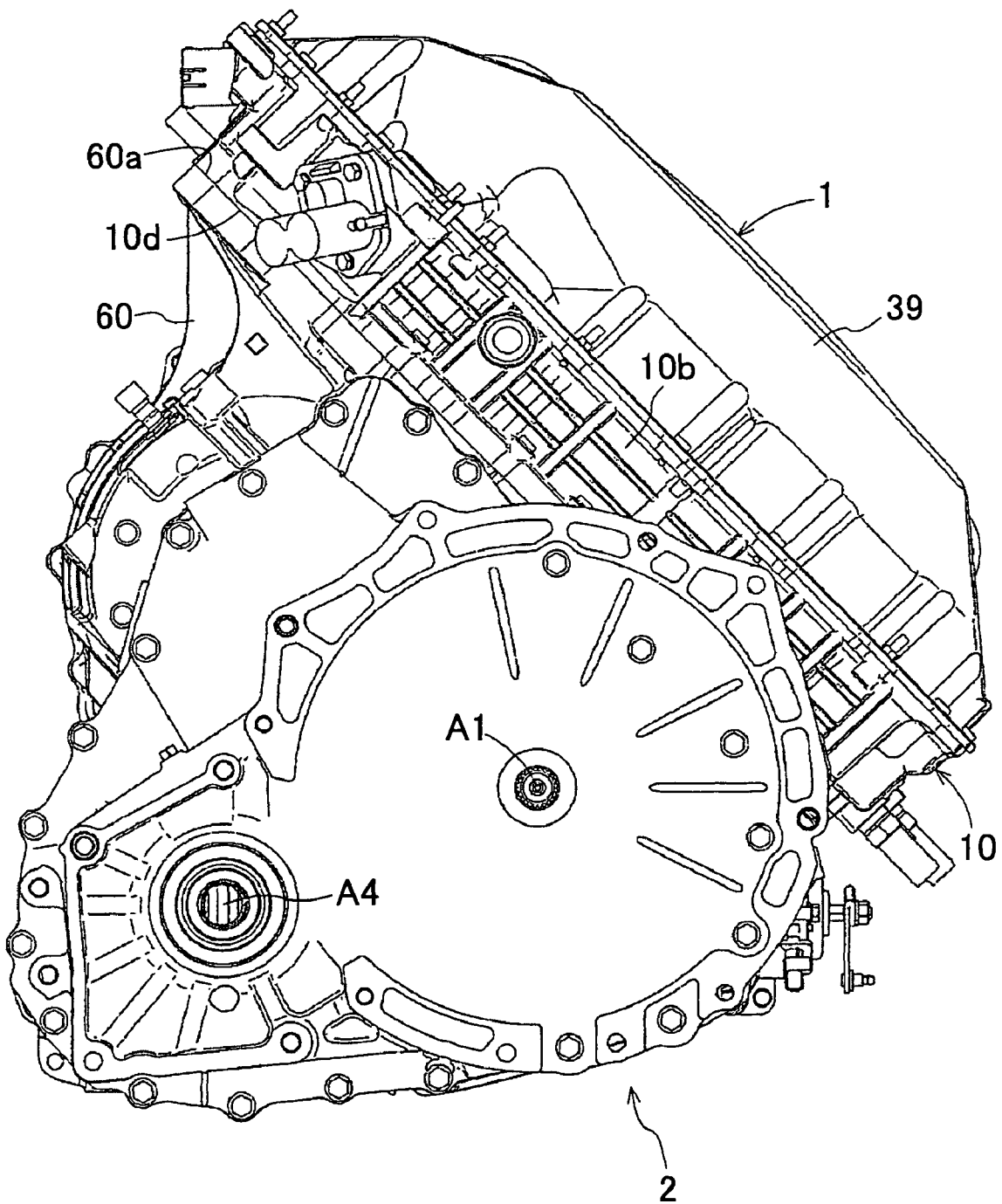
FIG. 3 is a side view of a drive unit on which the inverter unit is integrally mounted.

The inverter unit 1 is mounted integrally on the top of the drive unit 2. More specifically, the lower end surface 10d of a case frame 10 of the inverter unit 1 is fastened on the inclined upper side 60a of a drive unit case 60, as shown in FIG. 3. The upper side 60a of the drive unit case 60 is provided to be inclined so as to be nearly in contact with the outer peripheries of the motor M and generator G. The case frame 10 serving as a cooling unit is thereby provided integrally with the drive unit case 60; so is the inverter unit 1. Matching with the inverter unit 1 mounted on the drive unit 2 so as to be inclined, a cover 39 of the inverter unit 1 is formed virtually in a trapezoid shape whose breadth (length in the direction in parallel with the upper side 60a) decreases as it gets farther from the drive unit case 60 in the side view of the drive unit 2 obtained from the side on which it is connected to the engine. When the inverter unit 1 is mounted on the drive unit 2, the cover 39 is formed such that one lateral side thereof is almost level and that the other lateral side thereof is almost perpendicular. This allows the entire drive unit 2 on which the inverter unit 1 is mounted integrally to have a compact outline with fewer protrusions upward and sideward (toward the right side in FIG. 3).

Figure 6:
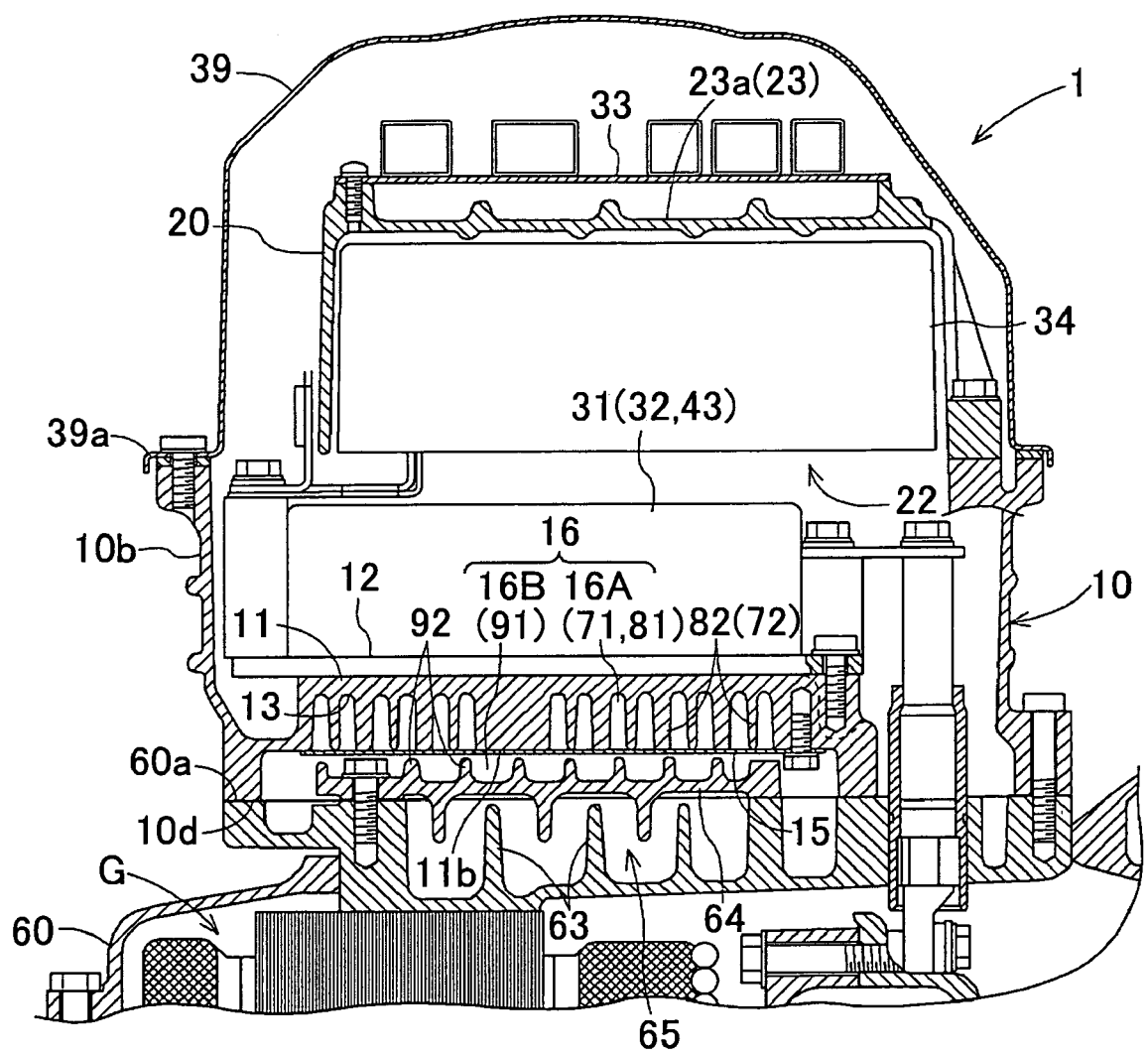
FIG. 6 is a longitudinal sectional view of an inverter unit.

As shown in FIG. 4, a cooling structure for cooling heat generating components included in the inverter unit 1 and the motor M and generator G included in the drive unit 2 is provided at the junction of the inverter unit 1 and drive unit 2. As shown in FIG. 6 as well, the cooling structure includes a hydraulic oil passage 65 that carries hydraulic oil (an example of coolant for cooling rotating electrical machines) circulating in the drive unit 2 and a coolant passage 16 that carries coolant, such as cooling water and cooling fluid; it is structured such that heat is exchanged therebetween. The hydraulic oil passage 65 is formed to be a space that has fins 63 on the top of the drive unit case 60. A heat transfer wall 64 is mounted to cover the open face of the hydraulic oil passage 65. The heat transfer wall 64 has heat transfer fins on both sides, exchanging heat between the hydraulic oil in the hydraulic oil passage 65 and the coolant in the coolant passage 16. The coolant passage 16 is separated into two tiers, or upper and lower tiers, by a planar separator 15 to be mounted on a passage face 13 that is on a bottom 11 of the case frame 10 (the lower side of the bottom 11 in the example shown in the drawings). The passage on a side of the separator 15 facing the case frame 10 is an upper coolant passage 16A; the passage on a side of the separator 15 facing the drive unit case 60 is a lower coolant passage 16B. The upper coolant passage 16A is formed to be a space separated by cooling fins 82 (72) that are formed integrally on the passage face 13 on the bottom 11 of the case frame 10. The separator 15 is mounted to cover the open face of the space. The lower coolant passage 16B is formed to be a space between the separator 15 and heat transfer wall 64 and therearound. In the embodiment, the upper coolant passage 16A includes a reactor cooler 71 and switching element cooler 81 (shown in FIG. 8); the lower coolant passage 16B includes a rotating electrical machine cooler 91. The structure of the coolant passage 16 will be described below.

Inside the hydraulic oil passage 65, the hydraulic oil that has been heated through circulation in the drive unit 2 is cooled by exchanging heat with the coolant flowing in the lower coolant passage 16B (rotating electrical machine cooler 91) via the heat transfer wall 64. The hydraulic oil that has been cooled is supplied to and cools the motor M and generator G in the drive unit 2. As described below, large electric currents flow in switching element modules 31 and 32 including switching elements 6 and 7 for the inverter and switching elements 8 for voltage boosting conducts strong electric currents, thereby generating much heat. A reactor 43 also generates relatively much heat, generating less heat than the switching elements 31 and 32. The case frame 10 serving as a cooling unit is structured to cool the heat generating components. The switching element modules 31 and 32, and reactor 43 are, therefore, disposed to be in contact with a cooling face 12 on the bottom 11 of the case frame 10 (the upper side of the bottom 11 in the example shown in the drawings); they are cooled by exchanging heat with the coolant flowing in the upper coolant passage 16A via the cooling fins 82 (72) formed integrally on the passage face 13 that is on the bottom 11 of the case frame 10. In order to carry out such a heat exchange, it is preferable that the case frame 10 including the cooling fins 82 (72) and the heat transfer wall 64 be structured using a thermal conductive material, such as aluminum. On the other hand, it is preferable that the separator 15 be structured using a material with low thermal conductivity in order to hinder a heat exchange between the upper coolant passage 16A and lower coolant passage 16B.

2. Schematic Structure of Entire Inverter Unit

Figure 1:
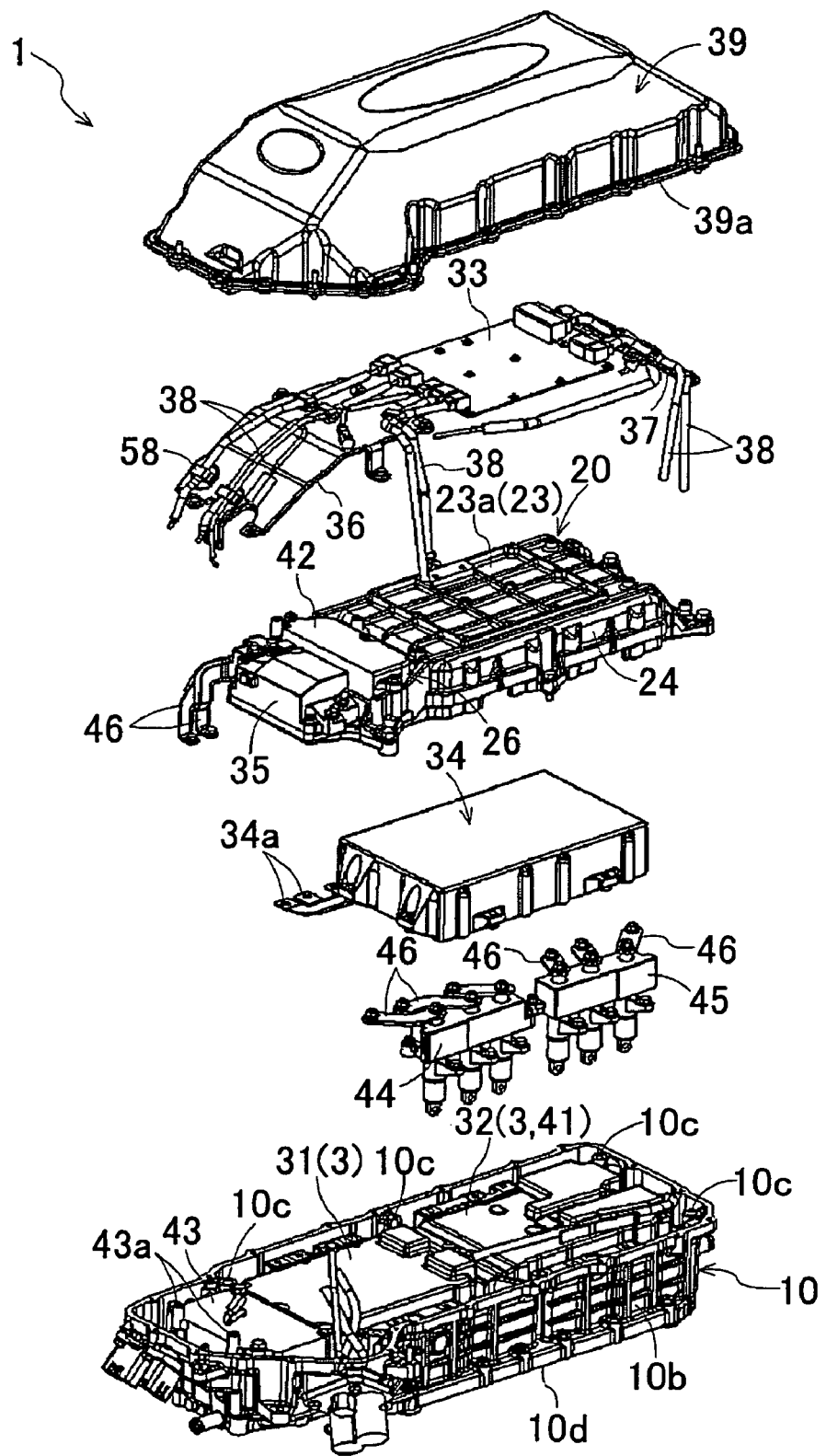
FIG. 1 is an exploded perspective view of an inverter unit according to an embodiment of the present invention.
Figure 2:
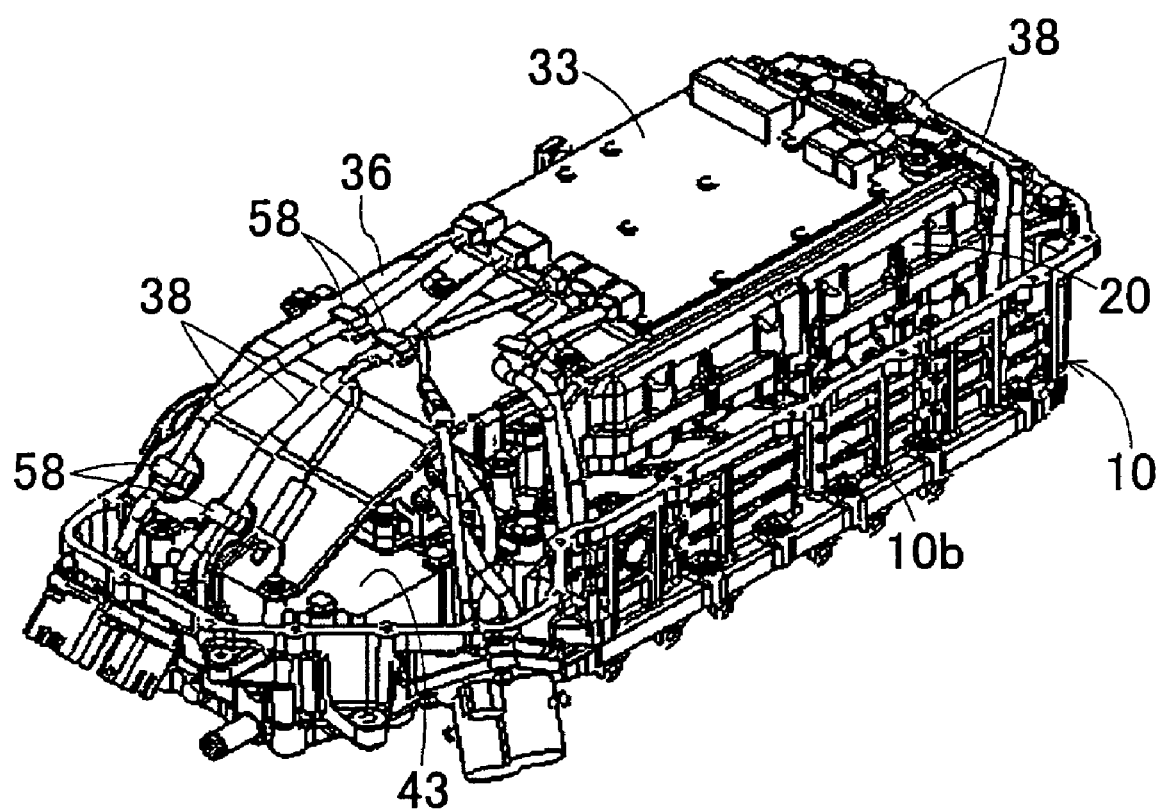
FIG. 2 is a perspective view of the inverter unit with its cover detached therefrom.

The schematic structure of the entire inverter unit 1 will be described hereinafter. In the following description, "upper" or "upward" indicates the side on which the cover 39 of the inverter unit 1 is (the upper side in FIGS. 1, 2, 4 and 6); "lower" or "downward" indicates the side on which the case frame 10 of the inverter unit 1 is (the lower side in FIGS. 1, 2, 4 and 6), unless otherwise noted. As shown in FIGS. 1 and 2, the inverter unit 1 includes, as circuit components forming electrical circuitry, a reactor 43 forming a voltage boost circuit 4 for boosting a power supply voltage, a first switching element module 31 that is supplied with a power supply voltage boosted by the voltage boost circuit 4, embedded with first switching elements 6 for the inverter forming an inverter circuit 3 for driving (controlling) the motor M, and a second switching element module 32 that is embedded with second switching elements 7 for the inverter forming an inverter circuit 3 for driving (controlling) the generator G and switching elements 8 for voltage boosting forming the voltage boost circuit. The inverter unit 1 includes a capacitor 42 for voltage boosting forming the voltage boost circuit 4 that includes the reactor 43 and the switching elements 8 for voltage boosting, a control board 33 for controlling the inverter circuits 3, a smoothing capacitor 34 for smoothing an input power supply to the inverter circuit 3, and a noise filter 35 for rejecting power supply noise. Furthermore, the inverter unit 1 includes a case frame 10 and supporting bracket 20 to support the circuit components.

The frame case 10 includes a bottom 11 (shown in FIGS. 4 and 6) and a peripheral wall 10b that is disposed around the periphery of the bottom 11, and has the shape of a box with its upper side, or the side facing the supporting bracket 20, open. The case frame 10 is structured using a metal material, such as aluminum, manufactured by die casting. The planar surface of the bottom 11 is virtually rectangular. The case frame 10 has the shape of a box that is virtually rectangular parallelepiped with its upper side open. A plurality of ribs are formed around the outer peripheral surface of the peripheral wall 10b in order to improve heat dissipation from, lighten, and increase the rigidity of the case frame 10. The first switching element module 31, second switching element module 32 and reactor 43 are accommodated and secured in the case frame 10. The first switching element module 31, second switching element module 32, and reactor 43 are arranged to be in contact with the cooling face 12 that is formed of the inner side (upper side) of the bottom 11 (as shown in FIGS. 4 and 6). A first current sensor 44 for detecting the magnitude of a current flowing from the first switching element module 31 to the motor M and a second current sensor 45 for detecting the magnitude of a current flowing from the second switching element module 32 to the generator G are also accommodated in the case frame 10. In the case frame 10, a plurality of mounting/attaching portions 10c to mount the supporting bracket 20 on are also provided along the inner peripheral surface of the peripheral wall 10b. The supporting bracket 20 is fastened on and supported by the mounting/attaching portions 10c.

The supporting bracket 20 includes an opening 22 (shown in FIGS. 4 and 6) that opens downward to the lower side, or the side on which the case frame 10 is, an almost planar bottom 23, and a first box-shaped portion 21 including a peripheral wall 24 that is disposed around the periphery of the bottom 23. The supporting bracket 20 is structured using a metal material, such as aluminum, manufactured by die casting. The smoothing capacitor 34 is accommodated in the first box-shaped portion 21 included in the supporting bracket 20. As shown in FIG. 1, the smoothing capacitor 34 is virtually rectangular parallelepiped, and includes a connection terminal 34a protruding out of the opening 22 when it is accommodated in the first box-shaped portion 21. A control board 33 is secured on the outer side 23a of the bottom 23 included in the first box-shaped portion 21. Thus, the control board 33 is secured on the side that is opposite to the side on which the smoothing capacitor 34 is secured in the supporting bracket 20. The supporting bracket 20 also includes a second box-shaped portion 26 that is adjacent to the first box-shaped portion 21 and opens upward, or toward the side opposite to that on which the first box-shaped portion 21 is. A capacitor 42 for voltage boosting is accommodated and secured in the second box-shaped portion 26. A noise filter 35 is secured on the side opposite to that on which the first box-shaped portion 21 is with respect to the capacitor 42 for voltage boosting in the supporting bracket 20.

Figure 5:
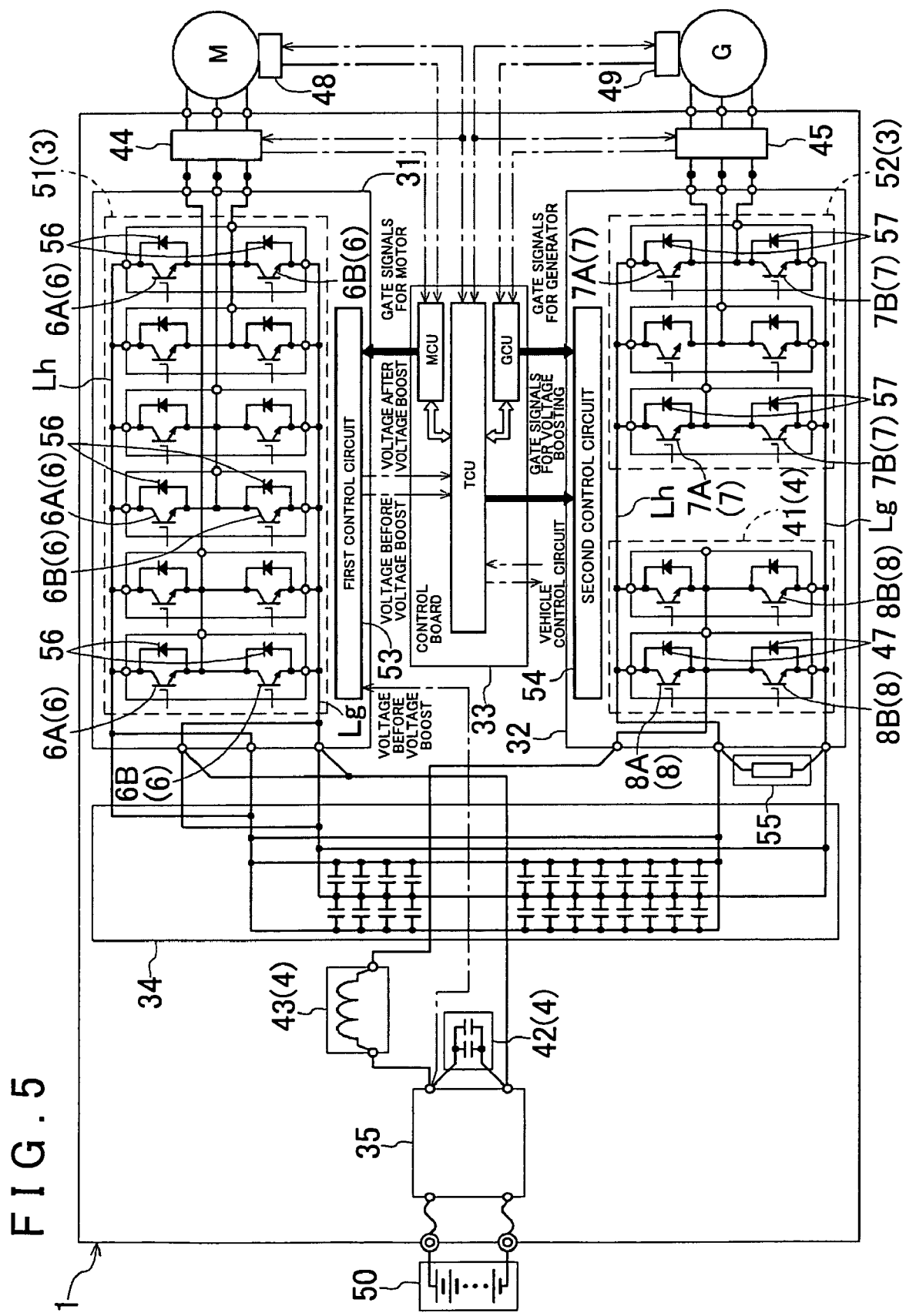
FIG. 5 is a schematic view showing the circuit structure in the inverter unit.

In the supporting bracket 20, a first wiring bracket 36 is secured on one side in the longitudinal direction of the supporting bracket 20 so as to be adjacent to the control board 33, and a second wiring bracket 37 is secured on the other side. On the upper side of each of the first and second wiring brackets 36 and 37, cables 38 to be connected to the control board 33 are secured with clamp members 58. The switching element modules 31 and 32, smoothing capacitor 34, capacitor 42 for voltage boosting, reactor 43, current sensors 44 and 45, and the like are electrically connected by a plurality of busbars 46 for connecting given terminals of the components to form electrical circuitry to be described below (as shown in FIG. 5).

The cover 39 is secured on the upper side of the case frame 10, and more specifically, on the upper end surface of the peripheral wall 10b. The inner space covered with the case frame 10 and cover 39 thereby has a fluid-tight structure, which is capable of protecting all members secured in the case frame 10 and supporting bracket 20. The cover 39 is secured on the case frame 10 by tightening against a plurality of bolt holes provided along the upper end surface of the peripheral wall 10b bolts serving as fastening members that are inserted into fastening holes provided on a flange-shaped periphery 39a formed at the lower end of the cover 39.

3. Structure of Electrical Circuitry for Inverter Unit

The structure of electrical circuitry for the inverter unit 1 will be described hereinafter. The inverter unit 1 controls the motor M and generator G included in the drive unit 2. The motor M and generator G are rotating electrical machines driven by a three-phase alternating current. As shown in FIG. 5, the inverter unit 1 includes, as circuit components forming the electrical circuitry, the first switching element module 31, second switching element module 32, control board 33, smoothing capacitor 34, noise filter 35, discharge resistor 55, capacitor 42 for voltage boosting, reactor 43, first current sensor 44, and second current sensor 45. As a power supply, a battery 50 is connected to the inverter unit 1. While a detailed description of its structure is omitted, the noise filter 35 functions to reject power supply noise from the battery 50. The inverter unit 1 boosts a voltage across the battery 50, converts a direct current to a three-phase alternating current at a predetermined frequency, and supplies the motor M therewith to control the driven state of the motor M. The inverter unit 1 also controls the driven state of the generator G, converts an alternating current generated by the generator G to a direct current, and stores by supplying the battery 50 therewith, or converts again the converted direct current to a three-phase alternating current to supply the motor M therewith. The motor M includes a motor rotation sensor 48; the generator G includes a generator rotation sensor 49; any of them is structured to output a signal descriptive of a detection value of its rotation speed to the control board 33.

The first switching element module 31 is embedded with a first switching unit 51 for supplying electric power to the motor M to drive the motor M, and a first control circuit 53. The first switching element module 31 is structured such that elements and boards forming the first switching unit 51 and first control circuit 53, terminals for connecting them to the exterior, and the like are integrally formed of resin. The second switching element module 32 is embedded with a switching unit 41 for voltage boosting that is used to boost a power supply voltage, a second switching unit 52 for supplying electric power to and driving the generator G, and a second control circuit 54. The second switching element module 32 is structured such that elements and boards forming the switching unit 41 for voltage boosting, the second switching unit 52 and the second control circuit 54, terminals for connecting them to the exterior, and the like are integrally formed of resin. In the embodiment, an inverter circuit 3 is formed of each of the first switching unit 51 and second switching unit 52. In the description of the embodiment, merely the "inverter circuit 3" is used to refer to the two inverter circuits 3 collectively.

The first switching unit 51 includes, as first switching elements 6 for the inverter, pairs of a first upper arm element 6A and a first lower arm element 6B that are connected in series; for each phase (each of three phases: U phase, V phase and W phase) of the motor M, it includes two pairs of, or four, first switching elements 6 for the inverter. Since the output of the motor M is set larger than that of the generator G in the embodiment, two pairs of first switching elements 6 for the inverter are provided for each phase. A placement area for the first switching elements 6 for the inverter, therefore, needs to be larger than a placement area for the second switching elements 7 for the inverter for driving the generator G. In the embodiment, insulated gate bipolar transistors (IGBTs) are used for the first switching elements 6 for the inverter. The emitter of the first upper arm element 6A and the collector of the first lower arm element 6B that are included in each pair are connected respectively to a coil for each phase of the motor M, the coil not shown in the drawings. The collector of each of the first upper arm elements 6A is connected into a high-voltage power supply line Lh that is supplied with electric power after a voltage boost by the voltage boost circuit 4 that will be described below; the emitter of each of the first lower arm elements 6B is connected into a ground line Lg that is connected to the negative terminal of the battery 50. A freewheel diode 56 is connected in parallel to each of the first switching elements 6 for the inverter; the freewheel diodes 56 are also included in the first switching unit 51. As first switching elements 6 for the inverter, power transistors having various structures, such as bipolar, field-effect and metal-oxide-semiconductor (MOS) power transistors, may be used instead of IGBTs.

The first switching unit 51 is electrically connected to the control board 33 via the first control circuit 53. The plurality of first switching elements 6 for the inverter operate according to gate signals for the motor that are output from a motor control unit MCU included in the control board 33; a direct current flowing after a voltage boost by the voltage boost circuit 4 is thereby converted to a three-phase alternating current that has a predetermined frequency and current value, which is supplied to the motor M. The motor M is thereby driven at a predetermined output torque and rotation speed. The current flow between the first switching unit 51 and the coil for each phase of the motor M is detected by the first current sensor 44 that is provided between the first switching unit 51 and motor M. The detection value detected by the first current sensor 44 is sent to the motor control unit MCU included in the control board 33.

The second switching unit 52 includes, as second switching elements 7 for the inverter, pairs of a second upper arm element 7A and a second lower arm element 7B that are connected in series; for each phase (each of three phases: U phase, V phase and W phase) of the generator G, it includes one pair of, or two, second switching elements 7 for the inverter. Since the output of the generator G is set smaller than that of the motor M in the embodiment, one pair of second switching elements 7 for the inverter is provided for each phase, unlike the arrangement with the first switching elements 6 for the inverter. The placement area for the second switching elements 7 for the inverter, therefore, may be smaller than that for the first switching elements 6 for the inverter. In the embodiment, the second switching elements for the inverter are structured integrally with the switching elements 8 for voltage boosting such that they form one module (the second switching element module 32). In the embodiment, insulated gate bipolar transistors (IGBTs) are used for the second switching elements 7 for the inverter. The emitter of the second upper arm element 7A and the collector of the second lower arm element 7B that are included in each pair are connected respectively to a coil for each phase of the generator G, the coil not shown in the drawings. The collector of each of the second upper arm elements 7A is connected into the high-voltage power supply line Lh; the emitter of each of the second lower arm elements 7B is connected into the ground line Lg that is connected to the negative terminal of the battery 50. A freewheel diode 57 is connected in parallel to each of the second switching elements 7 for the inverter; the freewheel diodes 57 are also included in the second switching unit 52. As second switching elements 7 for the inverter, power transistors having various structures, such as bipolar, field-effect and metal-oxide-semiconductor (MOS) power transistors, may be used instead of IGBTs.

The second switching unit 52 is electrically connected to the control board 33 via the second control circuit 54. The plurality of second switching elements 7 for the inverter operate according to gate signals for the generator that are output from a generator control unit GCU included in the control board 33. The second switching unit 52 thereby converts to a direct current a three-phase alternating current that has been generated by the generator G, and supplies the battery 50 or first switching unit 51 therewith. The second switching unit 52 controls the value of a current flowing in the coil for each phase of the generator G, and thereby controls the rotation speed and output torque of the generator G. The current flow between the second switching unit 52 and the coil for each phase of the generator G is detected by the second current sensor 45 that is provided between the second switching unit 52 and generator G. The detection value detected by the second current sensor 45 is sent to the generator control unit GCU included in the control board 33.

The switching unit 41 for voltage boosting includes, as switching elements 8 for voltage boosting, pairs of an upper arm element 8A for voltage boosting and a lower arm element 8B for voltage boosting that are connected in series; it includes two pairs of, or four, switching elements 8 for voltage boosting. In the embodiment, insulated gate bipolar transistors (IGBTs) are used for the switching elements 8 for voltage boosting. The emitter of the upper arm element 8A for voltage boosting and the collector of the lower arm element 8B for voltage boosting that are included in each pair are connected to the positive terminal of the battery 50 via the reactor 43. The collector of each of the upper arm elements 8A for voltage boosting is connected into the high-voltage power supply line Lh that is supplied with electric power after a voltage boost by the voltage boost circuit 4; the emitter of each of the lower arm elements 8B for voltage boosting is connected into the ground line Lg that is connected to the negative terminal of the battery 50. A freewheel diode 47 is connected in parallel to each of the switching elements 8 for voltage boosting; the freewheel diodes 47 are also included in the switching unit 41 for voltage boosting. As switching elements 8 for voltage boosting, power transistors having various structures, such as bipolar, field-effect and metal-oxide-semiconductor (MOS) power transistors, may be used instead of IGBTs.

The switching unit 41 for voltage boosting is electrically connected to the control board 33 via the second control circuit 54. The plurality of switching elements 8 for voltage boosting operate according to gate signals for voltage boosting that are output from a transaxle control unit TCU included in the control board 33. The switching unit 41 thereby boosts a voltage across the battery 50 to a predetermined voltage, and supplies the first switching unit 51 therewith. When receiving electric power from the generator G, the switching unit 41 for voltage boosting supplies the battery 50 with a voltage that is generated by the generator G and decreased to a predetermined voltage by the plurality of switching elements 8 for voltage boosting. The capacitor 42 for voltage boosting is connected in parallel with the battery 50 via the noise filter 35. The capacitor 42 for voltage boosting smoothes a voltage across the battery 50, functioning to supply the smoothed direct current voltage to the switching unit 41 for voltage boosting. Thus, the switching unit 41 for voltage boosting including the switching elements 8 for voltage boosting, the capacitor 42 for voltage boosting, and the reactor 43 form the voltage boost circuit 4.

The smoothing capacitor 34 is connected between the high-voltage power supply line Lh that is supplied with electric power after a voltage boost by the voltage boost circuit 4 and the ground line Lg that is connected to the negative terminal of the battery 50. The smoothing capacitor 34 smoothes a direct current voltage after a voltage boost by the voltage boost circuit 4, functioning to supply the smoothed direct current voltage mainly to the first switching unit 51. The discharge resistor 55 is connected in parallel to the smoothing capacitor 34. The discharge resistor 55 functions to discharge the charge stored in the smoothing capacitor 34 during a power-off state or the like.

The control board 33 is a board on which control circuitry for controlling at least the inverter circuit 3 is formed, and on which control circuitry for controlling the first and second switching units 51 and 52 serving as inverter circuits 3, and the switching unit 41 for voltage boosting is formed in the embodiment. The control board 33 thereby controls the entire drive unit 2. With regard to units for respective functions, the control board 33 includes a transaxle control unit TCU, motor control unit MCU, and generator control unit GCU. The transaxle control unit TCU is a control unit for controlling the entire drive unit 2. The detection value of a power supply voltage prior to a voltage boost by the voltage boost circuit 4 (the voltage prior to a voltage boost) and the detection value of a voltage after the voltage boost (the voltage after the voltage boost) are input to the transaxle control unit (TCU) via the first control circuit 53. Various types of information, such as an extent of accelerator operation, an extend of brake operation, and a vehicle speed, are sent and received between the transaxle control unit TCU and a control unit included in a vehicle having the drive unit 2 through a communication mean such as a controller area network (CAN). Based on the information, the transaxle control unit TCU generates and outputs an operation command to each of the motor control unit MCU and generator control unit GCU. The transaxle control unit TCU also generates a gate signal for voltage boosting that serves as a drive signal for driving each of the switching elements 8 for voltage boosting that are included in the switching unit 41 for voltage boosting, outputting it to the second control circuit 54.

An operation command issued from the transaxle control unit TCU to the motor control unit MCU or generator control unit GCU is the command value of a rotation speed or output torque of the motor M or generator G. The detection value of a current flow between the first switching unit 51 and the coil for each phase of the motor M that has been detected by the first current sensor 44 and the detection value of a rotation speed of the motor M that has been detected by the motor rotation sensor 48 are input to the motor control unit MCU. Based on the detection values and the operation command from the transaxle control unit TCU, the motor control unit MCU generates a gate signal for the motor serving as a drive signal for driving the first switching elements 6 for the inverter included in the first switching unit 51, outputting it to the first control circuit 53. The detection value of a current flow between the second switching unit 52 and the coil for each phase of the generator G that has been detected by the second current sensor 45 and the detection value of a rotation speed of the generator G that has been detected by the generator rotation sensor 49 are input to the generator control unit GCU, as well. Based on the detection values and the operation commands from the transaxle control unit TCU, the generator control unit GCU generates a gate signal for the generator serving as a drive signal for driving the second switching elements 7 for the inverter included in the second switching unit 52, outputting it to the second control circuit 54.

4. Structure Details of Main Part of Inverter Unit

The structure details of the main part of the inverter unit 1 according to the embodiment will be described hereinafter, referring to FIGS. 6 to 10. The inverter unit 1 includes the case frame 10 serving as a cooling unit that is provided with the coolant passage 16 for carrying coolant along the cooling face 12 that is in contact with the reactor 43, the switching elements 8 for voltage boosting, and the switching elements 6 and 7 for the inverter (shown in FIG. 5). As described above, the first switching elements 6 for the inverter are embedded in the first switching element module 31, and the second switching elements 7 for the inverter and the switching elements 8 for voltage boosting are embedded in the second switching element module 32 in the embodiment. That is, the switching elements 8 for voltage boosting and the switching elements 6 and 7 for the inverter are structured to be in contact with the cooling face 12 as the first switching element module 31 and second switching element module 32 that are embedded therewith in the present embodiment. The coolant passage 16 includes the reactor cooler 71 for cooling an area on the cooling face 12 that is in contact with the reactor 43, and the switching element cooler 81 for cooling an area on the cooling face 12 that is in contact with the first switching element module 31 and second switching element module 32, the reactor cooler 71 disposed upstream with respect to the switching element cooler 81. As described above, the case frame 10 is provided integrally with the drive unit case 60, the coolant passage 16 having the rotating electrical machine cooler 91 for cooling the motor M and generator G upstream with respect to the reactor cooler 71. The structure of the case frame 10 serving as a cooling unit and its surroundings will be described in detail hereinafter.

Figure 7:
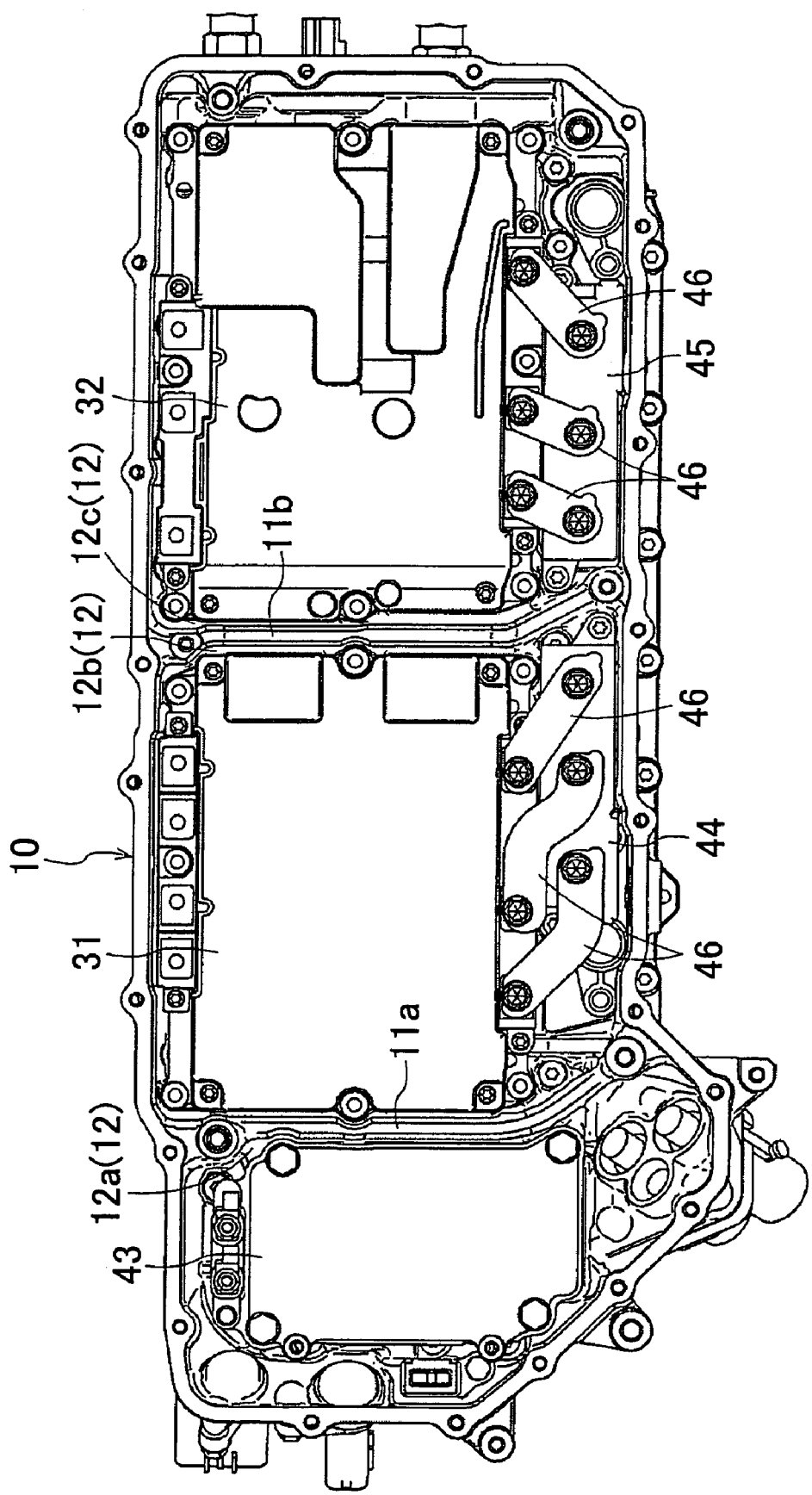
FIG. 7 is a plane view showing component arrangement in a case frame serving as a cooling unit.

As shown in FIGS. 1 and 6, the case frame 10 has the shape of a box that is virtually a rectangular parallelepiped opening upward, including the bottom 11 whose planar surface is virtually rectangular and the peripheral wall 10b that is disposed around the periphery of the bottom 11. The first switching element module 31, second switching element module 32, and the reactor 43 are disposed to be in contact with the inner side (the upper side in FIG. 6) of the bottom 11 included in the case frame 10 (as shown in FIG. 7). In the embodiment, the inner side of the bottom 11 included in the case frame 10 is the cooling face 12 for cooling the switching element modules 31 and 32 (or the switching elements 8 for voltage boosting and the switching elements 6 and 7 for the inverter) and the reactor 43.

As shown in FIG. 7, the circuit components that are cooled by the cooling face 12 are disposed on the cooling face 12 of the case frame 10 in the following order from one side (the left side in FIG. 7) to the other side (the right side in FIG. 7) in the longitudinal direction of the case frame 10: the reactor 43, first switching element module 31, and second switching element module 32. The cooling face 12 of the case frame 10 is divided into a reactor contact area 12a that the reactor 43 is in contact with, a first module contact area 12b that the first switching element module 31 is in contact with, and a second module contact area 12c that the second switching element module 32 is in contact with. A first rib 11a is provided between the reactor 43 and first switching element module 31. A second rib 11b is provided between the first switching element module 31 and second switching element module 32. Each of the contact areas 12a to 12c is a section but virtually planar. The respective ribs 11a and 11b are disposed from the cooling face 12 so as to cross the case frame 10 in the width direction, reinforcing the case frame 10. Any of the reactor 43, first switching element module 31 and second switching element module 32 has a planar side (bottom side) in contact with the cooling face 12 so as to be in contact with a large area of the contact area 12a, 12b, or 12c that is planar, being virtually rectangular parallelepiped in the example shown in the drawings.

On one side (the lower side in FIG. 7) of the first switching element module 31 and second switching element module 32 in the width direction of the case frame 10, the first current sensor 44 is disposed to be adjacent to the first switching element module 31; the second current sensor 45 is disposed to be adjacent to the second switching element module 32.

As shown in FIG. 6, the coolant passage 16 in which coolant flows is provided on a side of the bottom 11 included in the case frame 10 that is opposite to the cooling face 12, that is, on the outer side (the lower side in FIG. 6) of the bottom 11 that faces the drive unit 2. This is, the outer side of the bottom 11 included in the case frame 10 is the passage face 13 along which the coolant passage 16 is provided in the embodiment. As described below, the cooling fins 72 and 82 for the reactor cooler 71 and switching element cooler 81 are provided on the passage face 13 of the bottom 11 included in the case frame 10. As described above, the coolant passage 16 is separated into two tiers, or upper and lower tiers, by the planar separator 15 to be mounted on a passage face 13. The passage on the (upper) side of the separator 15 facing the case frame 10 is the upper coolant passage 16A; the passage on the (lower) side of the separator 15 facing the drive unit case 60 is the lower coolant passage 16B. In the embodiment, the upper coolant passage 16A includes the reactor cooler 71 and switching element cooler 81 (shown in FIG. 8); the lower coolant passage 16B includes the rotating electrical machine cooler 91. The reactor cooler 71 and switching element cooler 81 are thereby formed on one side of the separator 15. The rotating electrical machine cooler 91 is formed on the other side thereof.

The hydraulic oil passage 65 that is surrounded by the drive unit case 60 and heat transfer wall 64 is provided on the side on which the drive unit 2 is with respect to the lower coolant passage 16B. Hydraulic oil circulating inside the drive unit 2 flows in the hydraulic oil passage 65. The hydraulic oil that has been heated in the hydraulic oil passage 65 exchanges heat with the coolant flowing in the rotating electrical machine cooler 91 included in the lower coolant passage 16B via the heat transfer wall 64; thereby it is cooled. Thus, the hydraulic oil is cooled; thereby the motor M and generator G included in the drive unit 2 are cooled. In the embodiment, the heat transfer wall 64 is an example of a heat exchanger according to one aspect of the present invention.

Figure 8:
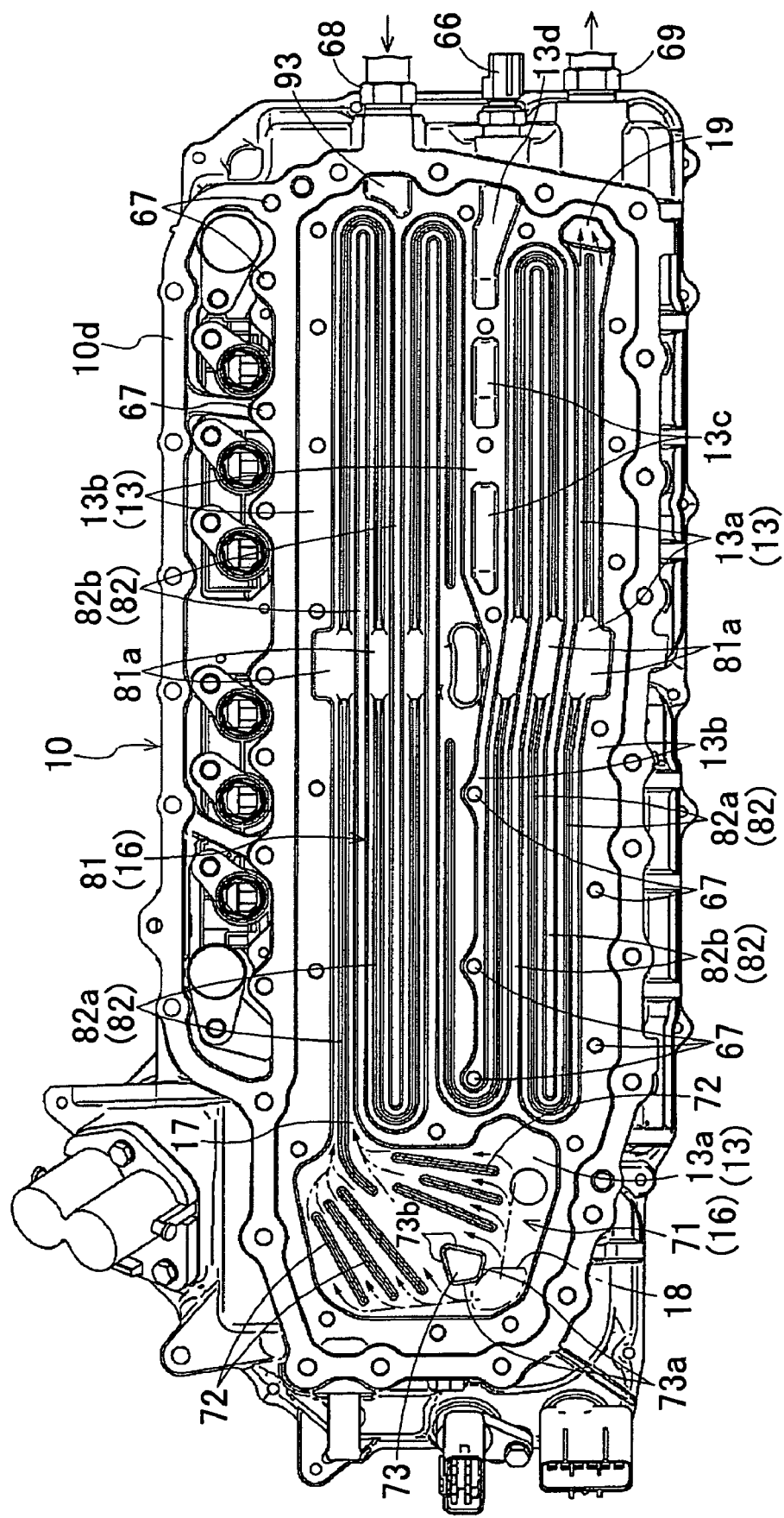
FIG. 8 is a plane view showing the structures of a reactor cooler and a switching element cooler.
Figure 10:
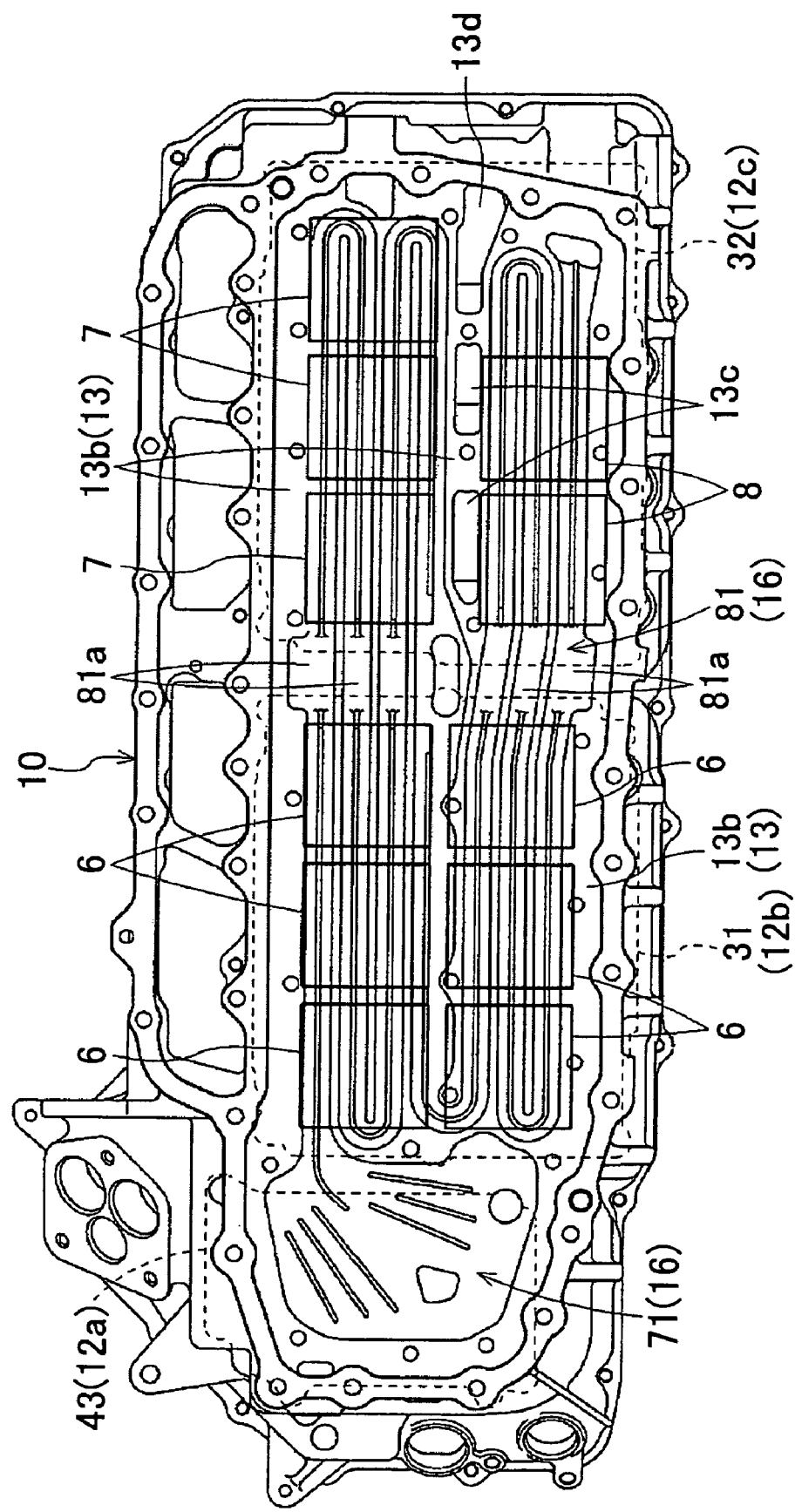
FIG. 10 is a descriptive view illustrating the positional relationship of a coolant passage, a reactor, a switching element for voltage boosting, and a switching element for the inverter.

FIG. 8 is a plane view showing the structure of the upper coolant passage 16A including the reactor cooler 71 and switching element cooler 81, corresponding to the bottom view of the case frame 10. FIG. 10 is a descriptive view illustrating the positional relationship of the reactor cooler 71 and switching element cooler 81, and the reactor contact area 12a, first module contact area 12b and second module contact area 12c. A dashed line shown in FIG. 10 indicates the outline of each of the reactor 43, first switching element module 31, and second switching element module 32 that are in contact with the respective contact areas 12a to 12c on the cooling face 12 that is positioned on the back side of the passage face 13. Solid lines placed in the dashed lines indicating the first switching element module 31 and second switching element module 32 indicate the arrangement of the first switching elements 6 for the inverter, the second switching elements 7 for the inverter, and the switching elements 8 for voltage boosting that are embedded in the respective switching element modules 31 and 32. As shown in the drawings, the reactor cooler 71 provided on the back side of the reactor contact area 12a with which the reactor 43 is in contact on the cooling surface 12 (on the passage face 13 side). Also, the reactor cooler is a cooler for cooling the reactor contact area 12a. The switching element cooler 81 provided on the back side of the first module contact area 12b with which the first switching element module 31 is in contact and the second module contact area 12c with which the second switching element module 32 is in contact on the cooling surface 12 (on the passage face 13 side). Also, the switching element cooler 81 is a cooler for cooling the first module contact area 12b and second module contact area 12c.

As shown in FIG. 8, the reactor cooler 71 is disposed upstream with respect to the switching element cooler 81 due to the direction of the coolant flow. The reactor cooler 71 communicates with the switching element cooler 81 via a communicating opening 17. That is, the coolant to flow into the upper coolant passage 16A first flows into the reactor cooler 71 through a coolant inlet 18 (shown in FIG. 9) provided on the separator 15, and then flows from the reactor cooler 71 through the communicating opening 17 into the switching element cooler 81; the coolant that has passed through the switching element cooler 81 flows out of the case frame 10 through a coolant outlet 19. Thus, the reactor cooler 71 and switching element cooler 81 are positioned, which allows cooling the entire reactor contact area 12a generally evenly with relatively cool coolant that has not cooled the first switching element module 31 and second switching element module 32 yet. Since the reactor 43 generates less heat than the first switching element module 31 and second switching element module 32, the coolant that has cooled the reactor 43 is not heated much. It is, therefore, possible to cool the first switching element module 31 and second switching element module 32 properly with the switching element cooler 81. In the embodiment, the coolant outlet 19 communicates with a connector 69 on the outlet side that is provided on the peripheral wall 10b of the case frame 10. The coolant is discharged out of the inverter unit 1 through the connector 69 on the outlet side.

The reactor cooler 71 includes the plurality of reactor cooling fins 72; the switching element cooler 81 includes the plurality of switching element cooling fins 82. Any of the cooling fins 72 and 82 is disposed to extend from a bottom side 13a (the side located at the highest level in FIG. 6) that is located on the side closest to the cooling face 12 (the upper side) in the passage face 13 toward the drive unit 2 (the lower side). As clearly shown in FIG. 8, the arrangement density of reactor cooling fins 72 is set lower than that of the switching element cooling fins 82. The arrangement density of the cooling fins 72 or 82 may be defined, for example, as the surface area of the cooling fins 72 or 82 per unit of volume in each of the coolers 71 and 81. By establishing such a relationship between the arrangement density of reactor cooling fins 72 and that of the switching element cooling fins 82, it is possible to set properly the arrangement density of the cooling fins 72 and 82 to be provided in the respective coolers 71 and 81 according to the temperature of the coolant in the respective coolers 71 and 81 and the heat generated by the targets to be cooled by the respective coolers 71 and 81, which allows cooling each of the reactor 43, first switching element module 31, and second switching element module 32 properly. In this structure, the arrangement density of reactor cooling fins 72 that are positioned upstream in the coolant passage 16 is set lower, which allows minimizing the flow resistance in the entire coolant passage 16. It is, therefore, possible to downsize a pump for circulating the coolant in the coolant passage 16.

The reactor cooler 71 is formed as a space that is virtually a trapezoid corresponding to the reactor contact area 12a in the plane views of FIGS. 8 and 10. The reactor cooler 71 has a weir 73 for preventing a linear coolant flow from the coolant inlet 18 to the communicating opening 17 at a position adjacent to the coolant inlet 18 through which the coolant flows in. In the example shown in the drawings, the weir 73 is formed as a convexity that is disposed to extend virtually from the bottom 13a of the passage face 13 toward the drive unit 2 (the lower side) and that is (or whose cross section in parallel with the bottom 11 of the case frame 10 is) virtually quadrangular in the plane view of FIG. 8. Two sides of the weir 73 that face the coolant inlet 18 form weir faces 73a for preventing a linear coolant flow from the coolant inlet 18 to the communicating opening 17. As shown by the dashed-dotted lines in FIG. 8, the coolant flowing through the coolant inlet 18 into the reactor cooler 71 can thereby be guided in the directions along the weir faces 73a, which allows preventing a linear coolant flow from the coolant inlet 18 to the communicating opening 17 and spreading the coolant generally evenly through the entire reactor cooler 71. It is, therefore, possible to cool the entire reactor contact area 12a more evenly. The other two sides of the weir 73 that are opposite to the weir faces 73a form convergent faces 73b for converging in the direction toward the communicating opening 17 the coolant flows divided in the directions along the weir faces 73a.

The reactor cooling fins 72 are formed virtually radially to converge the coolant flows divided by weir 73 in the direction toward the communicating opening 17. The reactor cooling fins 72 are virtually radially formed in the plane view of FIG. 8 (in the cross section in parallel with the bottom 11 of the case frame 10). The coolant flows divided by the weir 73 can be controlled and converged into a flow in the direction toward the communicating opening 17 by the reactor cooling fins 72. It is, therefore, possible to spread through the entire reactor cooler 71 and guide smoothly to the communicating opening 17 the coolant flowing in through the coolant inlet 18, which allows cooling the entire reactor contact area 12a more evenly and minimizing the flow resistance in the reactor cooler 71. While each of the reactor cooling fins 72 is linear in the plane view of the example shown in the drawings to enhance productivity, it may be formed in the shape of a curved line, such as an arc, in a plane view. In the embodiment, the height of the reactor cooling fins 72 and weir 73 that is measured from the bottom 13a of the passage face 13 is set smaller than that of the mount face 13b with which the separator 15 is to be mounted to come into contact in the passage face 13. More specifically, the reactor cooling fins 72 and weir 73 are set to have a little gap above the height thereof that is measured from the bottom 13a of the passage face 13 below the separator 15 that is mounted on the mount face 13b.

The switching element cooler 81 is formed as a strip-shaped flow passage disposed in a serpentine shape in a space that is virtually rectangular in the plane view of FIG. 8, corresponding to both the first module contact area 12b and second module contact area 12c. To form such a serpentine flow passage, the serpentine-shaped switching element cooler 81 includes the switching element cooling fins 82 for forming a serpentine coolant flow that flexes a plurality of times between the communicating opening 17 and coolant outlet 19. While the increase in flow resistance in the switching element cooler 81 is limited by decreasing divergences of the flow passage, the switching element cooling fins 82 are disposed at high density. A large surface area in contact with the coolant flowing in the switching element cooler 81 for exchanging heat with the first module contact area 12b and second module contact area 12c is thereby secured. Thus, it is possible to cool properly the switching element modules 31 and 32 that generate more heat than the reactor 43 and are cooled downstream with respect to the reactor 43.

In the embodiment, the switching element cooler 81 is equipped with two types of switching element cooling fins 82 that are heat dissipation fins 82a for heat dissipation and passage control fins 82b for heat dissipation and passage control. The height of the passage control fins 82b that is measured from the bottom 13a of the passage face 13 is set the same as that of the mount face 13b with which the separator 15 comes into contact; the edge of each of the passage control fins 82b comes into contact with the separator 15. On the other hand, the height of the heat dissipation fins 82a that is measured from the bottom 13a of the passage face 13 is set smaller than that of the passage control fins 82b with a little gap between the heat dissipation fins 82a and the separator 15 that is mounted on the mount face 13b. The passage control fins 82b form a serpentine flow passage in the switching element cooler 81. The heat dissipation fins 82a are disposed along the center part in the width direction of the serpentine flow passage formed by the passage control fins 82b, dividing the serpentine flow passage into two in the width direction.

The switching element cooler 81 has therein portions 81a with fewer fins in which the arrangement density of the switching element cooling fins 82 is lower than it is in other parts. The portions 81a with fewer fins are provided around the area corresponding to the back side (passage face 13 side) of the second rib 11b (shown in FIG. 7) that is provided on the cooling face 12. In the portions 81a with fewer fins, only passage control fins 82b are provided without heat dissipation fins 82a provided, thereby lowering the arrangement density of the switching element cooling fins 82. As shown in FIG. 10, no switching element module 31 or 32 is disposed in the position in which the second rib 11b is provided; no switching element 6 or 7 for the inverter, or switching element 8 for voltage boosting that is embedded in any of the switching element modules 31 and 32 is provided therein. On the other hand, both heat dissipation fins 82a and passage control fins 82b are provided in the areas in which the switching elements 6 and 7 for the inverter and the switching elements 8 for voltage boosting are disposed. The arrangement density of the switching element cooling fins 82 is set higher. This is, the switching element cooling fins 82 are disposed such that the arrangement density thereof is higher in an area corresponding to the switching elements 8 for voltage boosting or the switching elements 6 or 7 for the inverter on the cooling face 12 than it is in other areas. The switching element cooling fins 82 thus structured makes it possible to cool efficiently the switching elements 6 and 7 for the inverter and the switching elements 8 for voltage boosting that generate much heat. The areas in which no switching element 6 or 7 for the inverter, or switching element 8 for voltage boosting is provided are used as portions 81a with fewer fins in which the arrangement density of the switching element cooling fins 82 is lowered, thereby lowering the flow resistance in the entire switching element cooler 81.

As shown in FIG. 8, lightening cavities 13c and a temperature sensor cavity 13d are provided near the switching element cooler 81 on the passage face 13 of the bottom 11 included in the case frame 10. The lightening cavities 13c and temperature sensor cavity 13d are formed on the mount face 13b positioned in an area in which the distance between adjacent flow passages that are included in the serpentine passage in the switching element cooler 81 is larger. As shown in FIG. 10, the distance between a second switching element 7 for the inverter and a switching element 8 for voltage boosting is larger than that between adjacent first switching elements 6 for the inverter in the width direction of the case frame 10 in the embodiment. With this taken into consideration, the passage is disposed to cool the respective switching elements 6 to 8 evenly; thus, the distance between adjacent flow passages included in the switching element cooler 81 is larger in the area corresponding to that between the second switching elements 7 for the inverter and switching elements 8 for voltage boosting. In the area, the temperature sensor cavity 13d is provided to hold a temperature sensor 66 (shown in FIG. 8), and the detector of the temperature sensor 66 is inserted therein. As described below, the temperature sensor cavity 13d communicates with the rotating electrical machine cooler 91 via a temperature sensor communicating hole 15b on the separator 15, which allows the temperature sensor 66 to detect a temperature of the coolant in the rotating electrical machine cooler 91. In the remaining area in which the temperature sensor cavity 13d is not provided, the lightening cavities 13c are provided to reduce the thickness of the mount face 13b in the area the distance between the adjacent flow passages in the switching element cooler 81 is larger and to improve castability.

Figure 9:
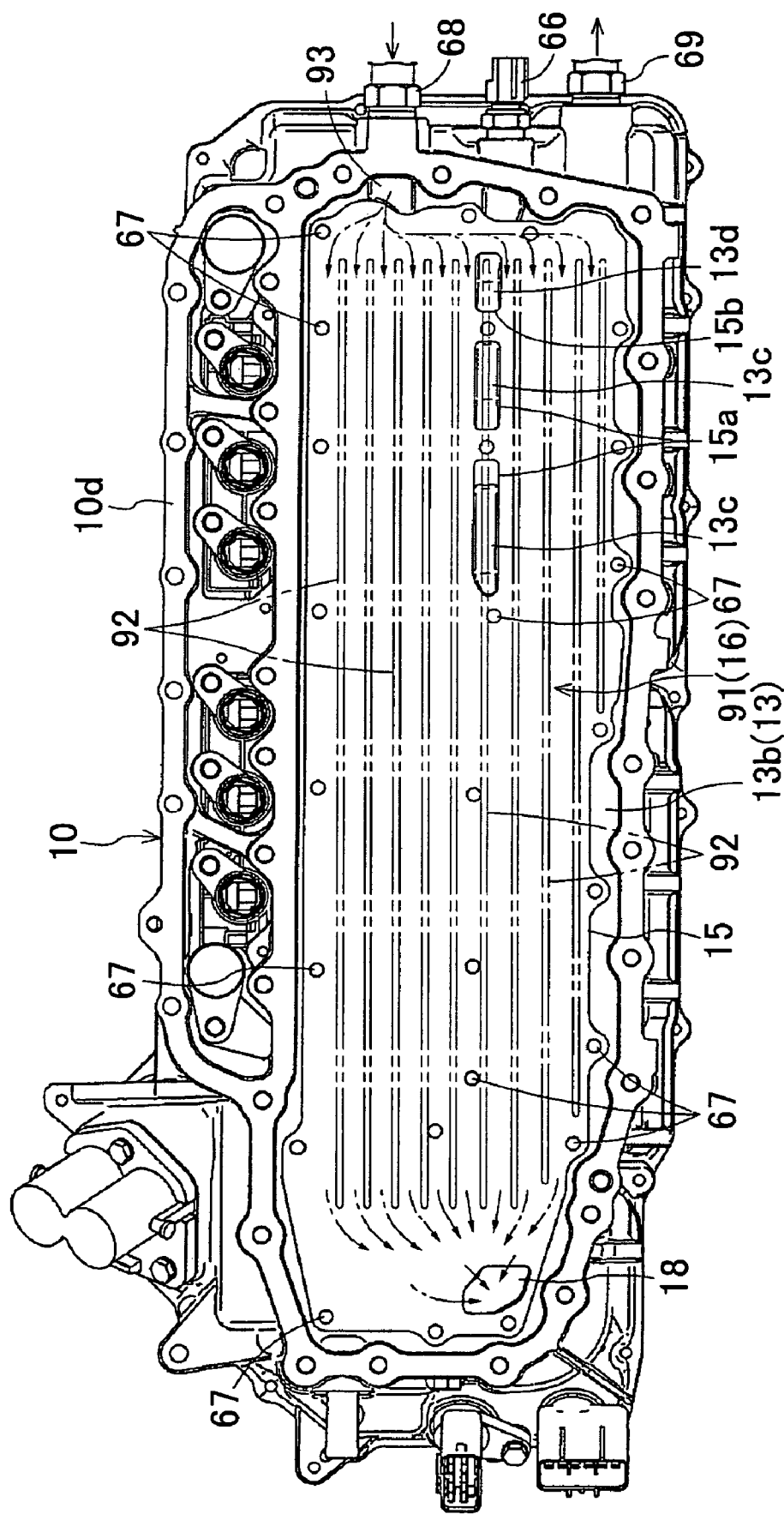
FIG. 9 is a plane view showing the structure of a rotating electrical machine cooler.

As shown in FIG. 9, the separator 15 is mounted on the mount face 13b that is on the passage face 13 of the case frame 10 on which the reactor cooler 71 and switching element cooler 81 are provided. As shown in FIG. 6, the coolant passage 16 is thereby divided into two tiers, or upper and lower tiers. The rotating electrical machine cooler 91 is formed in the lower coolant passage 16B. The separator 15 is secured on the mount face 13b with rivets 67 that are provided integrally with the mount face 13b of the case frame 10. FIG. 9 is a plane view showing the structure of the rotating electrical machine cooler 91 formed of the lower coolant passage 16B. Dashed double-dotted lines shown in the drawing indicate the arrangement of the rotating electrical machine cooling fins 92 in the rotating electrical machine cooler 91. The rotating electrical machine cooler 91 is formed as a space that is virtually rectangular in the plane view of FIG. 9, surrounded by the inner surface of the peripheral wall 10b included in the case frame 10 and the separator 15. The rotating electrical machine cooler 91 has a lower coolant inlet 93 on one side in the longitudinal direction thereof, and has, on the other side in the longitudinal direction, a lower coolant outlet that also serves as a coolant inlet 18 for the upper coolant passage 16A. In the embodiment, the lower coolant inlet 93 communicates with an inlet connector 68 that is provided on the peripheral wall 10b of the case frame 10. The coolant is introduced into the inverter unit 1 via the inlet connector 68. The coolant flowing through the lower coolant inlet 93 into the rotating electrical machine cooler 91 flows along the rotating electrical machine cooling fins 92 in the longitudinal direction of the rotating electrical machine cooler 91 through the lower coolant outlet (coolant inlet) 18, flowing through the lower coolant outlet (coolant inlet) 18 into the reactor coolant 71 included in the upper coolant passage 16A.

As shown in FIG. 6, the rotating electrical machine cooling fins 92 included in the rotating electrical machine cooler 91 are formed of heat transfer fins provided on the (upper) side of the heat transfer wall 64 that faces the case frame 10. As shown in the drawing, the rotating electrical machine cooling fins 92 are set high enough to have a little gap below the separator 15 with the case frame 10 mounted on the drive unit case 60. As shown in FIG. 9, the rotating electrical machine cooling fins 92 are formed as a plurality of linear fins in parallel with one another in the longitudinal direction of the rotating electrical machine cooler 91, or the longitudinal direction of the case frame 10. The rotating electrical machine cooling fins 92 form the flow of coolant flowing in the longitudinal direction of the rotating electrical machine cooler 91, that is, the flow of coolant flowing from the lower coolant inlet 93 to the lower coolant outlet (coolant inlet) 18 in the rotating electrical machine cooler 91. As clearly shown in FIGS. 8 and 9, the arrangement density of rotating electrical cooling fins 92 is set lower than that of reactor cooling fins 72. The arrangement density of rotating electrical machine cooling fins 92 may be defined, for example, as a surface area of the cooling fins 92 per unit of volume of the rotating electrical machine cooler 91, similar to the reactor cooling fins 72 and the switching element cooling fins 82. By establishing such a relationship between the arrangement density of rotating electrical machine cooling fins 92 and that of reactor cooling fins 72, it is possible to set properly the arrangement density of cooling fins 92 and 72 to be provided in the respective coolers 91 and 71 according to the temperature of the coolant in the respective coolers 91 and 71 and the heat generated by the targets to be cooled by the respective coolers 91 and 71, which allows cooling properly each of the hydraulic oil for cooling the motor M and generator G, and the reactor 43. In this structure, the arrangement density of rotating electrical machine cooling fins 92 in the rotating electrical machine cooler 91 that is positioned upstream with respect to the reactor cooler 71 in the coolant passage 16 is set lower, which allows minimizing of the flow resistance in the entire coolant passage 16. It is, therefore, possible to downsize a pump for circulating the coolant in the coolant passage 16.

As understood from FIG. 6, the coolant flowing in the rotating electrical machine 91 exchanges heat with the hydraulic oil flowing in the hydraulic oil passage 65 provided on the side of the heat transfer wall 64 that faces the drive unit case 60 via the heat transfer wall 64 that has the rotating electrical machine cooling fins 92 and the heat transfer fins that are on the opposite side (on the side facing drive unit case 60), cooling the hydraulic oil. The hydraulic oil that has been heated through circulation in the drive unit 2 is thereby cooled to cool the motor M and generator G.

As shown in FIG. 9, the separator 15 has lightening communicating holes 15a in positions corresponding to the lightening cavities 13c and a temperature sensor communicating hole 15b in a position corresponding to the temperature sensor cavity 13*d* on the passage face 13 of the frame case 10. With the separator 15 mounted on the mount face 13*a* that is on the passage face 13 of the case frame 10, the lightening cavities 13*c* provided on the passage face 13 thereby communicate with the rotating electrical machine cooler 91 via the lightening communicating holes 15*a*; the temperature sensor cavity 13*d* communicates with the rotating electrical machine cooler 91 via the temperature sensor communicating hole 15*b*. This allows the temperature sensor 66 whose detector is disposed inside the temperature sensor cavity 13*d* to detect a temperature of the coolant in the rotating electrical machine cooler 91. This also prevents a situation in which coolant accumulates in the lightening cavities 13*c* and cannot be drained therefrom.

5. Other Embodiments (1) In the above embodiment, the structure in which the arrangement density of reactor cooling fins 72 provided in the reactor cooler 71 is lower than that of the switching element cooling fins 82 provided in the switching element cooler 81, and in which the arrangement density of rotating electrical machine cooler fins 92 provided in the rotating electrical machine cooler 91 is lower than that of the cooling fins 72 and 82 is described as an exemplary embodiment. The settings of the arrangement density of the cooling fins 72, 82, and 92 are, however, an example. It is preferable that the arrangement density be suitably set according to the cooling capacity needed in the respective coolers 71, 81, and 91.

(2) In the above embodiment, the structure in which the reactor cooler 71 includes the weir 73 for preventing a linear coolant flow from the coolant inlet 18 into which the coolant flows to the communicating opening 17, and the reactor cooling fins 72 is disposed virtually radially for converging the coolant flows divided by the weir 73 in the direction toward the communicating opening 17 is described as an exemplary embodiment. Embodiments of the present invention are, however, not limited thereto. It is also preferable that the reactor cooler 71 be structured to include only the weir 73 or reactor cooling fins 72. It is also preferable that the reactor cooling fins 72 be structured to be disposed in a direction for preventing a linear coolant flow from the coolant inlet 18 into which the coolant flows to the communicating opening 17. The reactor cooling fins 72 thus function as a weir 73. Further, the form of the reactor cooling fins is not limited to a virtually radial form. It is also preferable that the reactor cooling fins 72 be disposed in a different form, for example, such a serpentine form that the switching element cooler 81 has. When the reactor cooling fins 72 are disposed in such a form, the weir 73 is not needed.

(3) In the above embodiment, the structure in which the switching element cooler 81 is formed as a strip-shaped flow passage that is serpentinely disposed is described as an exemplary embodiment. Embodiments of the present invention are, however, not limited thereto. The switching element cooler 81 may be formed of a flow passage that is disposed in a different form. It is, therefore, preferable that the switching element cooler 81 be formed, for example, of a plurality of linear flow passages in the direction from the communicating opening 17 to the coolant outlet 19. In this situation, it is preferable that the switching element cooling fins 82 be, for example, a plurality of linear cooling fins disposed along the direction from the communicating opening 17 to the coolant outlet 19.

(4) In the above embodiment, the situation in which the case frame 10 is a cooling unit is described as an example. Embodiments of the present invention are, however, not limited thereto. In other words, a structure in which a cooling unit is provided independently from the case frame 10 is also one exemplary embodiment of the present invention.

(5) In the above embodiment, the structure in which the case frame 10 serving as a cooling unit for the inverter unit 1 is provided integrally with the case 60 of the drive unit 2, and in which the rotating electrical machine cooler 91 for cooling the rotating electrical machines M and G of the drive unit 2 is included upstream with respect to the reactor cooler 71 is described as an exemplary embodiment. Embodiments of the present invention are, however, not limited thereto. In other words, a structure in which the inverter unit 1 is independent from the drive unit 2 is also one exemplary embodiment of the present invention. In this situation, it is preferable that the cooling unit for the inverter unit 1 include, as a coolant passage 16, a passage corresponding to the upper coolant passage 16A including the reactor cooler 71 and switching element cooler 81, not including the lower coolant passage 16B including the rotating electrical machine cooler 91.

(6) In the above embodiment, the structure in which the drive unit includes two rotating electrical machines, the motor M and generator G is described as an example. Embodiments of the present invention are, however, not limited thereto. The number of rotating electrical machines included in the drive unit and the function of each rotating electrical machine can be optionally changed. A structure in which one or more motor-generators functioning as a motor and generator if necessary is included, or in which only one of the motor M and generator. G is included in the drive unit is also one exemplary embodiment of the present invention.

(7) In the above embodiment, the situation in which the present invention is applied to the inverter unit 1 for controlling the rotating electrical machines M and G of the drive unit 2 for a hybrid vehicle is described as an example. The scope of applications of the present invention is, however, not limited thereto. An application to an inverter unit for controlling rotating electrical machines included in a vehicle that is not a hybrid vehicle, such as an electric vehicle, is also one exemplary embodiment of the present invention. Further, the scope of applications of the present invention is not limited to those concerning a drive unit of a vehicle. The present invention may be applied to an inverter unit for various apparatuses, such as an air conditioner, refrigerator, and elevator.

The present invention may be preferably used in an inverter unit used to control rotating electrical machines, such as a motor and generator.

According to an exemplary aspect of the invention, a virtually entire area on the cooling face of the cooling unit with which the reactor is in contact is cooled upstream with respect to the area on the cooling face with which the switching elements for voltage boosting and the switching elements for the inverter are in contact. It is, therefore, possible to cool generally evenly a whole side of the reactor forming the voltage boost circuit that is in contact with the cooling face with relatively cool coolant that has not cooled the switching elements for voltage boosting and the switching elements for the inverter yet. Since the reactor generates less heat than the switching elements for voltage boosting and the switching elements for the inverter, the coolant that has cooled the reactor is not so heated, which allows cooling properly the switching elements for voltage boosting and the switching elements for the inverter.

According to an exemplary aspect of the invention, the reactor cooler is disposed upstream with respect to the switching element cooler, whereby the coolant in the reactor cooler is cooler in temperature than the coolant in the switching element cooler. In addition, the reactor generates less heat than the switching elements. Accordingly, it is possible to cool the reactor properly even though the arrangement density of cooling fins in the reactor cooler is set lower than the arrangement density of cooling fins in the switching element cooler. That is, in this structure, the arrangement density of cooling fins in each of the coolers is set properly according to the temperature of the coolant in the cooler and the heat generated by the component to be cooled by the cooler. Therefore, it is possible to cool properly any of the reactor, the switching elements for voltage boosting, and the switching elements for the inverter. Further, in this structure, the arrangement density of cooling fins is set lower upstream in the coolant passage, whereby it is possible to keep the flow resistance in the entire coolant passage small, which allows downsizing a pump for circulating the coolant.

According to an exemplary aspect of the invention, it is possible to prevent with the weir a linear coolant flow heading from the coolant inlet to the communicating opening leading to the switching element cooler, which allows the coolant flowing in through the coolant inlet to spread evenly through the reactor cooler. Accordingly, it is possible to cool more evenly the whole side of the reactor that is in contact with the cooling face.

According to an exemplary aspect of the invention, it is possible to control the coolant flows divided by the weir so that they may converge into a flow in the direction toward the communicating opening leading to the switching element cooler using the cooling fins that are disposed virtually in a radial form, which makes it possible that the coolant flowing in through the coolant inlet spreads generally evenly through the reactor cooler while it flows smoothly to the communicating opening leading to the switching element cooler. Accordingly, it is possible to cool more evenly the whole side of the reactor that is in contact with the cooling face and minimize the flow resistance in the reactor cooler.

According to an exemplary aspect of the invention, it is possible to increase the arrangement density of cooling fins in the switching element cooler and limit the increase in flow resistance in the switching element cooler by decreasing divergences of the flow passage. Accordingly, it is possible to cool properly the switching elements that generate more heat than the reactor and that are cooled downstream with respect to the reactor.

According to an exemplary aspect of the invention, it is possible to cool more efficiently any of the switching elements for the inverter and the switching elements for voltage boosting that generate much heat. The arrangement density of cooling fins in an area in which no switching element for the inverter or switching element for voltage boosting is disposed is set low, which allows keeping the flow resistance in the entire switching element cooler small.

According to an exemplary aspect of the invention, the reinforcement rib that generates no heat is provided between the first switching element module and second switching element module, in which case the arrangement density of cooling fins in the area corresponding to the position of the rib that does not net to be cooled as much is set lower. Accordingly, it is possible to cool properly the respective switching element modules and keep the flow resistance in the entire switching element cooler small.

According to an exemplary aspect of the invention, the "rotating electrical machine" is used as a concept containing all of the motor (electric motor), generator, and motor-generator that functions as a motor and generator if necessary.

When two inverter circuits for supplying electric power respectively to two rotating electrical machines whose outputs are different are included, the switching elements for the inverter forming the inverter circuit for supplying electric power to the rotating electrical machine whose output is smaller may be arranged in a smaller arrangement area than the switching elements for the inverter forming the inverter circuit for supplying electric power to the rotating electrical machine whose output is larger. According to this structure, in addition to the switching elements for voltage boosting, the switching elements for the inverter that may be arranged in a smaller arrangement area are embedded in the second switching element module. On the other hand, the switching elements for the inverter that need a larger arrangement area are embedded in the first switching element module. Accordingly, it is possible to modularize, according to the size of each of their arrangement areas, the switching elements for the inverter whose arrangement areas are different in size due to the different outputs of the rotating electrical machines.

According to an exemplary aspect of the invention, the cooling unit is provided integrally with the case of the drive unit including the rotating electrical machine, in which case it is possible to cool the rotating electrical machine using the same coolant passage that is used for cooling the reactor, the switching elements for voltage boosting, and the switching elements for the inverter. In this situation, the rotating electrical machine cooler is provided upstream with respect to the reactor cooler, which allows cooling the rotating electrical machine properly with cool coolant. Thus, the rotating electrical machine is cooled with cool coolant, which allows cooling the rotating electrical machine properly even though the arrangement density of cooling fins in the rotating electrical machine cooler is set smaller than that in the reactor cooler. It is thereby possible to keep the flow resistance in the rotating electrical machine cooler small, which allows keeping the flow resistance in the entire coolant passage small.

According to an exemplary aspect of the invention, the coolant passage provided in the cooling unit is separated into two tiers with the separator, whereby the reactor cooler and the switching element cooler, and the rotating electrical machine cooler are formed. Accordingly, it is possible to form the reactor cooler, the switching element cooler, and rotating electrical machine cooler in the cooling unit using a simple and compact structure.

According to an exemplary aspect of the invention, it is possible to cool the rotating electrical machine properly using the coolant by cooling the coolant for cooling the rotating electrical machine in the rotating electrical machine cooler.

What is claimed is:

1. An inverter unit comprising:
   a reactor and switching elements that form a voltage boost circuit that boosts a power supply voltage;
   a switching element for an inverter that forms an inverter circuit to be supplied with the power supply voltage boosted by the voltage boost circuit; and
   a cooling unit provided with a coolant passage that carries coolant along a cooling face with which the reactor and the switching elements of the voltage boost circuit and the switching element of the inverter circuit are in contact, wherein:
   the coolant passage includes a reactor cooler that cools an area on the cooling face with which the reactor is in contact, and a switching element cooler that cools an area on the cooling face with which the switching elements of the voltage boost circuit and the switching element of the inverter circuit are in contact, and the reactor cooler is disposed upstream with respect to the switching elements cooler.

2. The inverter unit according to claim 1, wherein the reactor cooler and switching element cooler have cooling fins, and an arrangement density of the cooling fins in the reactor cooler is set lower than an arrangement density of the cooling fins in the switching element cooler.

3. The inverter unit according to claim 2, wherein the reactor cooler communicates with the switching element cooler via a communicating opening and the reactor cooler includes, at a location adjacent to a coolant inlet in which coolant flows, a weir that prevents a linear coolant flow from a coolant inlet to the communicating opening.

4. The inverter unit according to claim 3, wherein the reactor cooler includes a cooling fin that is disposed virtually in a radial form that converges the coolant flow divided by the weir in a direction toward the communicating opening.

5. The inverter unit according to claim 2, wherein the switching element cooler includes a cooling fin disposed in a serpentine form that forms a serpentine coolant flow that flexes a plurality of times from a communicating opening to a coolant outlet.

6. The inverter unit according to claim 2, wherein the switching element cooler includes cooling fins that are arranged such that an arrangement density in areas corresponding to positions of the switching elements of the voltage boost circuit or the switching element of the inverter circuit on the cooling face is set higher than that in other areas.

7. The inverter unit according to claim 6, wherein:
the switching elements of the inverter circuit is embedded in a first switching module, the switching elements of the voltage boost circuit are embedded in a second switching module, and the first switching element module and the second switching element module are arranged in contact with the cooling face;
the cooling unit includes a reinforcement rib between the first switching module and the second switching module on the cooling face; and
the other areas include an area corresponding to a position of the rib.

8. The inverter unit according to claim 7, wherein:
the inverter circuit includes two inverter circuits that supply electric power respectively to two rotating electrical machines whose outputs are different;
switching elements of an inverter circuit that supplies electric power to a rotating electrical machine whose output is larger are embedded in the first switching element module; and
switching elements of an inverter circuit that supplies electric power to the rotating electrical machine whose output is smaller are embedded in the second switching element module.

9. The inverter unit according to claim 2, wherein:
the cooling unit is provided integrally with a case of a drive unit including a rotating electrical machine;
the coolant passage has a rotating electrical machine cooler that cools the rotating electrical machine upstream with respect to the reactor cooler;
the rotating electrical machine cooler includes cooling fins; and
an arrangement density of cooling fins in the rotating electrical machine cooler is set smaller than that of the cooling fins in the reactor cooler.

10. The inverter unit according to claim 9, wherein the coolant passage is separated into two tiers with a planar separator to be mounted on a passage face of the cooling unit on which the cooling fins included in the reactor cooler and the switching element cooler are formed, so that the reactor cooler and the switching element cooler are formed on one side of the separator, and the rotating electrical machine cooler is formed on the other side.

11. The inverter unit according to claim 9, wherein the rotating electrical machine cooler includes a heat exchanger that exchanges heat for the coolant used to cool the rotating electrical machine.

12. The inverter unit according to claim 1, wherein the reactor cooler communicates with the switching element cooler via a communicating opening and the reactor cooler includes, at a location adjacent to a coolant inlet in which coolant flows, a weir that prevents a linear coolant flow from a coolant inlet to a communicating opening.

13. The inverter unit according to claim 12, wherein the reactor cooler includes a cooling fin that is disposed virtually in a radial form that converges the coolant flow divided by the weir in a direction toward the communicating opening.

14. An inverter unit comprising:
a reactor and switching elements that form a voltage boost circuit that boosts a power supply voltage;
a switching element for an inverter that forms an inverter circuit to be supplied with the power supply voltage boosted by the voltage boost circuit; and
a cooling unit provided with a coolant passage that carries coolant along a cooling face with which the reactor and the switching elements of the voltage boost circuit and the switching element of the inverter circuit are in contact, wherein:
the reactor, the switching elements of the voltage boost circuit and the switching element of the inverter circuit are arranged such that the coolant cools the reactor before the switching elements of the voltage boost circuit and the switching element of the inverter circuit.

15. The inverter unit according to claim 14, wherein:
the coolant passage includes a reactor cooler that cools an area on the cooling face with which the reactor is in contact, and a switching element cooler that cools an area on the cooling face with which the switching elements of the voltage boost circuit and the switching element of the inverter circuit are in contact, and
the coolant cools the area on the cooling face with which the reactor is in contact before the area on the cooling face with which the switching elements of the voltage boost circuit and the switching element of the inverter circuit are in contact.

16. The inverter unit according to claim 15, wherein the reactor cooler and switching element cooler have cooling fins, and an arrangement density of the cooling fins in the reactor cooler is set lower than an arrangement density of the cooling fins in the switching element cooler.

17. The inverter unit according to claim 16, wherein the switching element cooler includes a cooling fin disposed in a serpentine form that forms a serpentine coolant flow that flexes a plurality of times from a communicating opening to a coolant outlet.

18. The inverter unit according to claim 16, wherein the switching element cooler includes cooling fins that are arranged such that an arrangement density in areas corresponding to positions of the switching elements of the voltage boost circuit or the switching element of the inverter circuit on the cooling face is set higher than that in other areas.

19. The inverter unit according to claim 16, wherein:
the cooling unit is provided integrally with a case of a drive unit including a rotating electrical machine;
the coolant passage has a rotating electrical machine cooler that cools the rotating electrical machine upstream with respect to the reactor cooler;
the rotating electrical machine cooler includes cooling fins; and an arrangement density of cooling fins in the rotating electrical machine cooler is set smaller than that of the cooling fins in the reactor cooler.

20. The inverter unit according to claim 15, wherein the reactor cooler communicates with the switching element cooler via a communicating opening and the reactor cooler includes, at a location adjacent to a coolant inlet in which coolant flows, a weir that prevents a linear coolant flow from a coolant inlet to a communicating opening.

* * * * *